(12) United States Patent
Hong et al.

(10) Patent No.: US 9,984,650 B2
(45) Date of Patent: May 29, 2018

(54) DISPLAY APPARATUS

(71) Applicant: SAMSUNG DISPLAY CO., LTD., Yongin-si, Gyeonggi-do (KR)

(72) Inventors: Hyun-Seok Hong, Asan-si (KR); Hyo-Chul Lee, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 217 days.

(21) Appl. No.: 15/141,027

(22) Filed: Apr. 28, 2016

(65) Prior Publication Data

US 2017/0053617 A1    Feb. 23, 2017

(30) Foreign Application Priority Data

Aug. 17, 2015 (KR) .......................... 10-2015-0115626

(51) Int. Cl.
*G09G 3/36* (2006.01)
*G09G 5/00* (2006.01)
(Continued)

(52) U.S. Cl.
CPC ........... *G09G 5/003* (2013.01); *G09G 3/2096* (2013.01); *H05K 1/0228* (2013.01);
(Continued)

(58) Field of Classification Search
CPC .................. G09G 5/003; G09G 3/2096; G09G 2330/021; G09G 2310/08; G09G 2310/0281; G09G 2300/0426; G09G 2300/0408; G09G 2370/08; G09G 2330/06; H05K 1/147; H05K 1/181; H05K 1/0296;
(Continued)

(56) References Cited

U.S. PATENT DOCUMENTS

| 2008/0264673 | A1* | 10/2008 | Chi ....................... G06F 13/409 174/250 |
| 2009/0174646 | A1* | 7/2009 | Lim ..................... G09G 3/3677 345/100 |
| 2012/0212401 | A1* | 8/2012 | Bae ....................... G09G 3/3648 345/88 |

FOREIGN PATENT DOCUMENTS

| KR | 1020000075227 | 12/2000 |
| KR | 1020050001064 | 1/2005 |

(Continued)

OTHER PUBLICATIONS

European Search Report Issued in Corresponding European Application No. 16173753.1 dated Dec. 16, 2016.

*Primary Examiner* — Claire X Pappas
*Assistant Examiner* — Gerald Oliver
(74) *Attorney, Agent, or Firm* — F. Chau & Associates, LLC

(57) ABSTRACT

A display apparatus includes a printed circuit board (PCB). A power management integrated circuit (PMIC) is mounted on the PCB and is configured to generate first to fourth gate clock signals and first to fourth inversion gate clock signals. A phase of the first gate clock signal partially overlaps a phase of the second to fourth gate clock signal. Each of the first to fourth inversion gate clock signals has a phase opposite to that of a respective one of the first to fourth gate clock signals. A gate driver generates a plurality of gate signals based on the first to fourth gate clock signals and the first to fourth inversion gate clock signals and applies the plurality of gate signals to a plurality of gate lines. A display panel is connected to the plurality of gate lines.

20 Claims, 14 Drawing Sheets

(51) Int. Cl.
    *G09G 3/20*     (2006.01)
    *H05K 1/02*     (2006.01)
    *H05K 1/14*     (2006.01)
    *H05K 1/18*     (2006.01)

(52) U.S. Cl.
    CPC ........... *H05K 1/0296* (2013.01); *H05K 1/147* (2013.01); *H05K 1/181* (2013.01); *G09G 2300/0408* (2013.01); *G09G 2300/0426* (2013.01); *G09G 2310/0281* (2013.01); *G09G 2310/08* (2013.01); *G09G 2330/021* (2013.01); *G09G 2330/06* (2013.01); *G09G 2370/08* (2013.01); *H05K 2201/058* (2013.01); *H05K 2201/10128* (2013.01)

(58) Field of Classification Search
    CPC ........... H05K 1/0228; H05K 2201/058; H05K 2201/10128
    See application file for complete search history.

(56) References Cited

FOREIGN PATENT DOCUMENTS

| | | |
|---|---|---|
| KR | 1020090090493 | 8/2009 |
| KR | 1020150015639 | 2/2015 |

\* cited by examiner

DISPLAY APPARATUS

CROSS-REFERENCE TO RELATED APPLICATION

This application claims priority under 35 U.S.C. § 119 to Korean Patent Application No. 10-2015-0115626, filed on Aug. 17, 2015, in the Korean Intellectual Property Office (KIPO), the disclosure of which is incorporated by reference herein in its entirety.

TECHNICAL FIELD

Exemplary embodiments of the present invention relate to a display apparatus, and more particularly, to a display apparatus having a small bezel width.

DISCUSSION OF THE RELATED ART

A flat panel display (FPD) may include a liquid crystal display (LCD), a plasma display panel (PDP) or an organic light emitting display (OLED), for example.

A display apparatus of an FPD may include a display panel, a gate driver and a data driver. To reduce manufacturing cost, the number of data driver chips included in the display apparatus may be decreased. When the number of the data driver chips decreases, the number of gate lines, which connect the display panel with the gate driver, may increase. This may cause the display apparatus to have a large bezel width as well as decreased duration for charging pixels in the display panel.

SUMMARY

According to an exemplary embodiment of the present invention, a display apparatus includes a printed circuit board (PCB). A power management integrated circuit (PMIC) is mounted on the PCB, wherein the PMIC is configured to generate first, second, third and fourth gate clock signals and first, second, third and fourth inversion gate clock signals, wherein a phase of the first gate clock signal partially overlaps a phase of the second, third or fourth gate clock signal, wherein each of the first to fourth inversion gate clock signals has a phase opposite to that of a respective one of the first to fourth gate clock signals. A gate driver is configured to generate a plurality of gate signals based on the first to fourth gate clock signals and the first to fourth inversion gate clock signals, wherein the gate driver is configured to apply the plurality of gate signals to a plurality of gate lines. A display panel is connected to the plurality of gate lines. The PCB includes an insulation layer, first, second, third and fourth lines disposed on a first surface of the insulation layer, wherein the first to fourth lines transmit the first to fourth gate clock signals, respectively, and fifth, sixth, seventh and eighth lines disposed on a second surface of the insulation layer, wherein the second surface of the insulation layer faces the first surface of the insulation layer, wherein the fifth to eighth lines transmit the first to fourth inversion gate clock signals, respectively.

In an exemplary embodiment of the present invention, the first to fourth lines extend in a first direction, are disposed in a second direction that crosses the first direction, and are spaced apart from each other in the second direction, and the fifth to eighth lines are disposed on locations of the second surface of the insulation layer that correspond to locations of the first surface of the insulation layer where the first to fourth lines are disposed, respectively.

In an exemplary embodiment of the present invention, the first line on the first surface of the insulation layer transmits the first gate clock signal from the PMIC to the gate driver, and the fifth line is disposed on a location of the second surface of the insulation layer that corresponds to a location of the first surface of the insulation layer where the first line is disposed, wherein the fifth line transmits the first inversion gate clock signal from the PMIC to the gate driver.

In an exemplary embodiment of the present invention, each of the gate clock signals has an ON level for at least four consecutive horizontal time periods, and a duration during which the first gate clock signal has the ON level and a duration during which the second gate clock signal has the ON level overlap for at least three consecutive horizontal time periods.

In an exemplary embodiment of the present invention, the display panel includes a display region including a plurality of pixels and a peripheral region surrounding the display region, and the gate driver is disposed in the peripheral region of the display panel.

In an exemplary embodiment of the present invention, the display apparatus further includes a flexible PCB (FPCB) configured to electrically connect the PCB with the display panel, and the first to fourth gate clock signals and the first to fourth inversion gate clock signals are provided from the PMIC to the gate driver through the first to eighth lines in the PCB, and through a plurality of lines in the FPCB.

In an exemplary embodiment of the present invention, the display apparatus further includes a data driver disposed on the FPCB, wherein the data driver is configured to generate a plurality of data voltages to be applied to a plurality of data lines connected to the display panel.

In an exemplary embodiment of the present invention, the display apparatus further includes a first solder resist layer disposed on the first surface of the insulation layer on which the first, second, third and fourth lines are disposed, and a second solder resist layer disposed on the second surface of the insulation layer on which the fifth, sixth, seventh and eighth lines are disposed.

In an exemplary embodiment of the present invention, the PMIC further generates a fifth gate clock signal and a fifth inversion gate clock signal, wherein a phase of the fifth gate clock signal partially overlaps a phase of the first, second, third or fourth gate clock signal, wherein the fifth inversion gate clock signal has a phase opposite to that of the fifth gate clock signal, the gate driver generates the plurality of gate signals based on the first to fifth gate clock signals and the first to fifth inversion gate clock signals. The PCB further includes a ninth line disposed on the first surface of the insulation layer, wherein the ninth line transmits the fifth gate clock signal and a tenth line disposed on the second surface of the insulation layer, wherein the tenth line transmits the fifth inversion gate clock signal.

In an exemplary embodiment of the present invention, a ground layer between the second surface of the insulation layer and the fifth to eighth lines is omitted.

In an exemplary embodiment of the present invention, a difference between a low voltage level of the gate clock signals and a high voltage level of the gate clock signals is greater than about 10 Volts.

According to an exemplary embodiment of the present invention, a display apparatus includes a PCB. A PMIC is mounted on the PCB, wherein the PMIC is configured to generate first and second gate clock signals and first and second inversion gate clock signals, wherein a phase of the first gate clock signal partially overlaps a phase of the second gate clock signal, wherein each of the first and second inversion gate clock signals has a phase that is inverted with respect to a phase of one of the first and second gate clock signals, respectively. A gate driver is configured to generate a plurality of gate signals based on the first and second gate clock signals and the first and second inversion gate clock signals, wherein the gate driver is configured to apply the plurality of gate signals to a plurality of gate lines. A display panel is connected to the plurality of gate lines. The PCB includes an insulation layer, first and second lines disposed on a first surface of the insulation layer, wherein the first and second lines transmit the first and second gate clock signals, respectively, and third and fourth lines disposed on a second surface of the insulation layer, wherein the second surface of the insulation layer faces the first surface of the insulation layer, wherein the third and fourth lines transmit the first and second inversion gate clock signals, respectively.

In an exemplary embodiment of the present invention, the first and second lines extend in a first direction, are disposed in a second direction that crosses the first direction, and are spaced apart from each other in the second direction, and the third and fourth lines are disposed on locations of the second surface of the insulation layer that correspond to locations of the first surface of the insulation layer where the first and second lines are disposed, respectively.

In an exemplary embodiment of the present invention, the first line on the first surface of the insulation layer transmits the first gate clock signal from the PMIC to the gate driver, and the third line is disposed on a location of the second surface of the insulation layer that corresponds to a location of the first surface of the insulation layer where the first line is disposed, wherein the third line transmits the first inversion gate clock signal from the PMIC to the gate driver.

In an exemplary embodiment of the present invention, the PMIC further generates a third gate clock signal and a third inversion gate clock signal, wherein a phase of the third gate clock signal partially overlaps a phase of the first or second gate clock signal, wherein the third inversion gate clock signal has a phase that is inverted with respect to a phase of the third gate clock signal, the gate driver generates the plurality of gate signals based on the first to third gate clock signals and the first to third inversion gate clock signals. The PCB further includes a fifth line disposed on the first surface of the insulation layer, wherein the fifth line transmits the third gate clock signal, and a sixth line disposed on the second surface of the insulation layer, wherein the sixth line transmits the third inversion gate clock signal.

According to an exemplary embodiment of the present invention, a display apparatus includes a PCB. A PMIC is mounted on the PCB, wherein the PMIC is configured to generate first, second, third and fourth gate clock signals and first, second, third and fourth inversion gate clock signals, wherein a phase of the first gate clock signal partially overlaps a phase of the second, third or fourth gate clock signal, wherein each of the first to fourth inversion gate clock signals has a phase that is inverted with respect to a phase of one of the first to fourth gate clock signals, respectively. A gate driver is configured to generate a plurality of gate signals based on the first to fourth gate clock signals and the first to fourth inversion gate clock signals, wherein the gate driver is configured to apply the plurality of gate signals to a plurality of gate lines. A display panel is connected to the plurality of gate lines. The PCB includes an insulation layer. The PCB includes first, second, third, fourth, fifth, sixth, seventh and eighth lines disposed on a first surface of the insulation layer, wherein the first to eighth lines transmit the first to fourth gate clock signals and the first to fourth inversion gate clock signals, respectively. The PCB includes ninth, tenth, eleventh, twelfth, thirteenth, fourteenth, fifteenth and sixteenth lines disposed on a second surface of the insulation layer, wherein the second surface of the insulation layer faces the first surface of the insulation layer, wherein the ninth to sixteenth lines transmit the first to fourth gate clock signals and the first to fourth inversion gate clock signals, respectively. The PCB includes first, second, third, fourth, fifth, sixth, seventh and eighth vias formed through the insulation layer, wherein each of the first to eighth vias connects one of the first to eighth lines with a respective line, from among the ninth to sixteenth lines.

In an exemplary embodiment of the present invention, the first to eighth lines extend in a first direction, are disposed in a second direction that crosses the first direction, and are spaced apart from each other in the second direction, and the ninth to sixteenth lines are disposed on locations of the second surface of the insulation layer that correspond to locations of the first surface of the insulation layer where the first to eighth lines are disposed, respectively.

In an exemplary embodiment of the present invention, the first line on the first surface of the insulation layer and the ninth line on the second surface of the insulation layer are electrically connected by the first via and transmit the first gate clock signal from the PMIC to the gate driver.

In an exemplary embodiment of the present invention, each of the gate clock signals has an ON level for at least four consecutive horizontal time periods, and a duration during which the first gate clock signal has the ON level and a duration during which the second gate clock signal has the ON level overlap for at least three consecutive horizontal time periods.

In an exemplary embodiment of the present invention, the display panel includes a display region including a plurality of pixels and a peripheral region surrounding the display region, and the gate driver is disposed in the peripheral region of the display panel.

BRIEF DESCRIPTION OF THE DRAWINGS

The above and other features of the present invention will become more apparent by describing in detail exemplary embodiments of the present invention with reference to the accompanying drawings, in which.

DETAILED DESCRIPTION OF THE EMBODIMENTS

Figure 1:
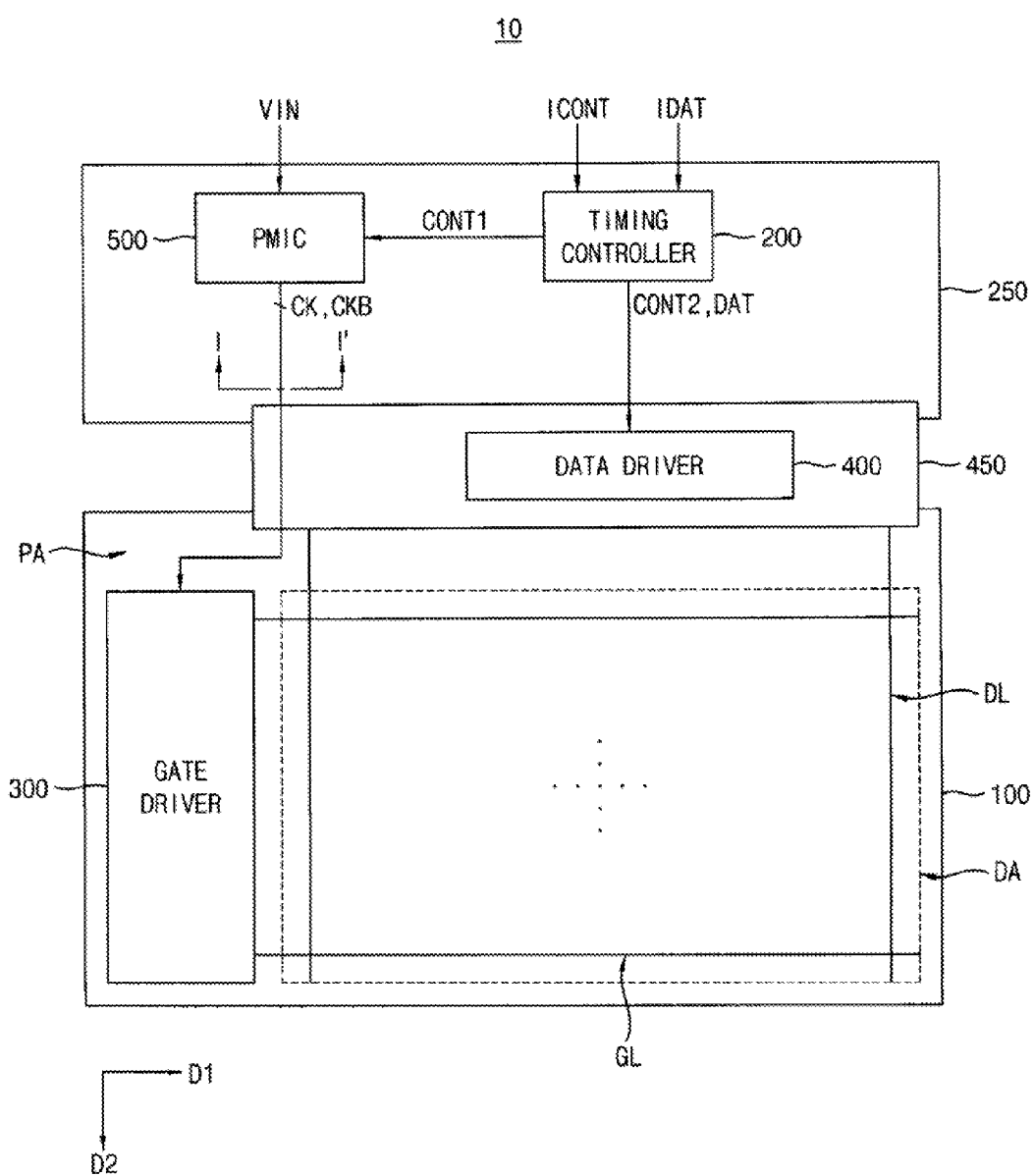
FIG. 1 is a block diagram illustrating a display apparatus according to an exemplary embodiment of the present invention.

Exemplary embodiments of the present invention will be described more fully hereinafter with reference to the accompanying drawings. The present invention may, however, be embodied in many different forms and should not be construed as limited to the exemplary embodiments set forth herein. Like reference numerals may refer to like elements throughout this application.

FIG. 1 is a block diagram illustrating a display apparatus according to an exemplary embodiment of the present invention.

Referring to FIG. 1, a display apparatus 10 includes a display panel 100, a timing controller 200, a printed circuit board (PCB) 250, a gate driver 300, a data driver 400, a flexible PCB (FPCB) 450 and a power management integrated circuit (PMIC) 500.

The display panel 100 is connected to a plurality of gate lines GL and a plurality of data lines DL. The gate lines GL may extend in a first direction D1, and the data lines DL may extend in a second direction D2 crossing (e.g., substantially perpendicular to) the first direction D1.

The display panel 100 may include a display region DA and a peripheral region PA. The display region DA may include a plurality of pixels that are arranged in a matrix form. Each pixel may be electrically connected to a respective one of the gate lines GL and a respective one of the data lines DL. The peripheral region PA may surround the display region DA. The display panel 100 may operate (e.g., display an image on the display region DA) based on output image data DAT.

The timing controller 200 controls an operation of the display panel 100 and controls operations of the gate driver 300, the data driver 400 and the PMIC 500. The timing controller 200 receives input image data IDAT and an input control signal ICONT from an external device (e.g., a host or a graphic processor). The input image data IDAT may include a plurality of input pixel data for the plurality of pixels. The input control signal ICONT may include a master clock signal, a data enable signal, a vertical synchronization signal, a horizontal synchronization signal, etc.

The timing controller 200 generates the output image data DAT based on the input image data IDAT. For example, the timing controller 200 may selectively perform an image quality compensation, a spot compensation, an adaptive color correction (ACC), and/or a dynamic capacitance compensation (DCC) on the input image data IDAT to generate the output image data DAT. The timing controller 200 generates a first control signal CONT1 based on the input control signal ICONT. The first control signal CONT1 may be provided to the PMIC 500, and a driving timing of the PMIC 500 may be controlled based on the first control signal CONT1. The first control signal CONT1 may include a vertical start control signal, a gate clock control signal, etc. The timing controller 200 generates a second control signal CONT2 based on the input control signal ICONT. The second control signal CONT2 may be provided to the data driver 400, and a driving timing of the data driver 400 may be controlled based on the second control signal CONT2. The second control signal CONT2 may include a horizontal start signal, a data clock signal, a data load signal, a polarity control signal, etc.

The PMIC 500 generates a plurality of gate clock signals CK, a plurality of inversion gate clock signals CKB and a vertical start signal based on an operating voltage VIN and the first control signal CONT1. The gate clock signals CK, the inversion gate clock signals CKB and the vertical start signal may be provided to the gate driver 300. A driving timing of the gate driver 300 may be controlled based on the gate clock signals CK, the inversion gate clock signals CKB and the vertical start signal. For example, the operating voltage VIN may include a gate-on voltage and a gate-off voltage. Each of the inversion gate clock signals CKB may have a phase opposite to that of a respective one of the gate clock signals CK.

The gate driver 300 generates a plurality of gate signals for driving the gate lines GL based on the gate clock signals CK, the inversion gate clock signals CKB and the vertical start signal. The gate driver 300 may sequentially apply the gate signals to the gate lines GL. For example, the gate driver 300 may include a plurality of shift registers.

In an exemplary embodiment of the present invention, the gate driver 300 may be an amorphous silicon gate (ASG) unit that is integrated in the display panel 100. For example, the gate driver 300 may be disposed in the peripheral region PA of the display panel 100 and may be adjacent to a first side (e.g., a short side on the left) of the display panel 100.

The data driver 400 generates a plurality of analog data voltages based on the second control signal CONT2 and the digital output image data DAT. The data driver 400 may sequentially apply the data voltages to the data lines DL. For example, the data driver 400 may include a shift register, a latch, a signal processor and a buffer.

The timing controller 200 and the PMIC 500 may be mounted on the PCB 250. The data driver 400 may be mounted on the FPCB 450. The FPCB 450 may electrically connect the PCB 250 with the display panel 100. For example, the PCB 250 and the FPCB 450 may be electrically connected by an anisotropic conductive film (ACF), and the FPCB 450 and the display panel 100 may be electrically connected by the ACF. For example, the FPCB 450 may be adjacent to a second side (e.g., a long side) of the display panel 100 crossing the first side of the display panel 100.

Although FIG. 1 illustrates an example where the display apparatus 10 includes a single data driver chip and a single FPCB 450, a display apparatus according to an exemplary embodiment of the present invention may include a plurality of data driver chips. In an exemplary embodiment of the present invention, when the display apparatus includes a plurality of data driver chips, the number of the FPCBs on which at least one data driver chip is mounted may be equal to or smaller than the number of the data driver chips.

In the display apparatus 10, according to an exemplary embodiment of the present invention, each gate signal may have an ON (e.g., a logical high state) level for at least two consecutive horizontal time periods (e.g., 2H) to increase a duration for charging each pixel. One horizontal time period (e.g., 1H) may correspond to a duration for charging a pixel with a data voltage. To generate the gate signal having the ON level for at least two consecutive horizontal time periods, the PMIC 500 may generate at least two gate clock signals CK such that a phase of one gate clock signal CK partially overlaps a phase of another gate clock signal CK. The gate clock signals CK and the inversion gate clock signals CKB may be provided from the PMIC 500 to the gate driver 300 through a plurality of lines in the PCB 250 and a plurality of lines in the FPCB 450.

FIGS. 2, 3, 4, 5, 6, 7, 8 and 9 are diagrams illustrating a display apparatus, according to exemplary embodiments of the present invention. FIGS. 2, 4, 6 and 8 are cross-sectional views of the PCB in the display apparatus taken along line I-I' of FIG. 1 and illustrate examples of structures including signal lines for transmitting the gate clock signals. FIGS. 3, 5, 7 and 9 illustrate examples of the gate clock signals transmitted through the structures of FIGS. 2, 4, 6 and 8, respectively.

Figure 2:
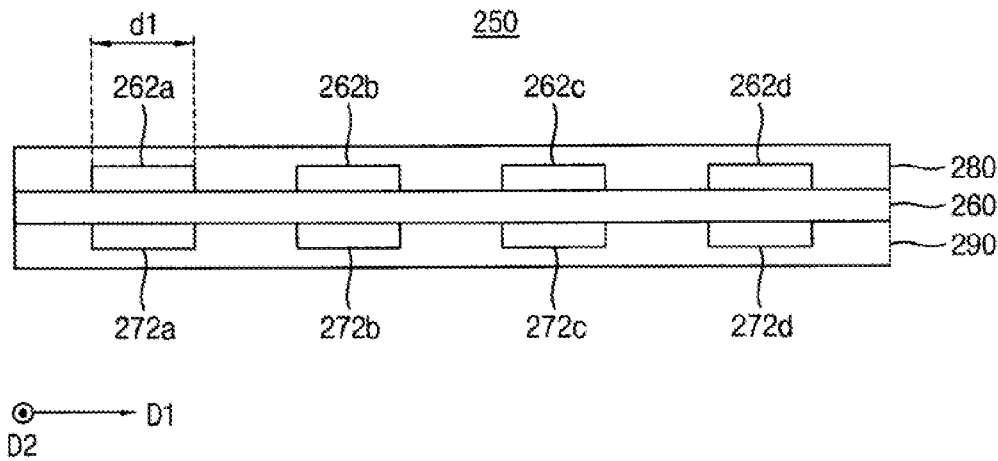
FIGS. 2, 3, 4, 5, 6, 7, 8 and 9 are diagrams illustrating a display apparatus, according to exemplary embodiments of the present invention.
Figure 3:
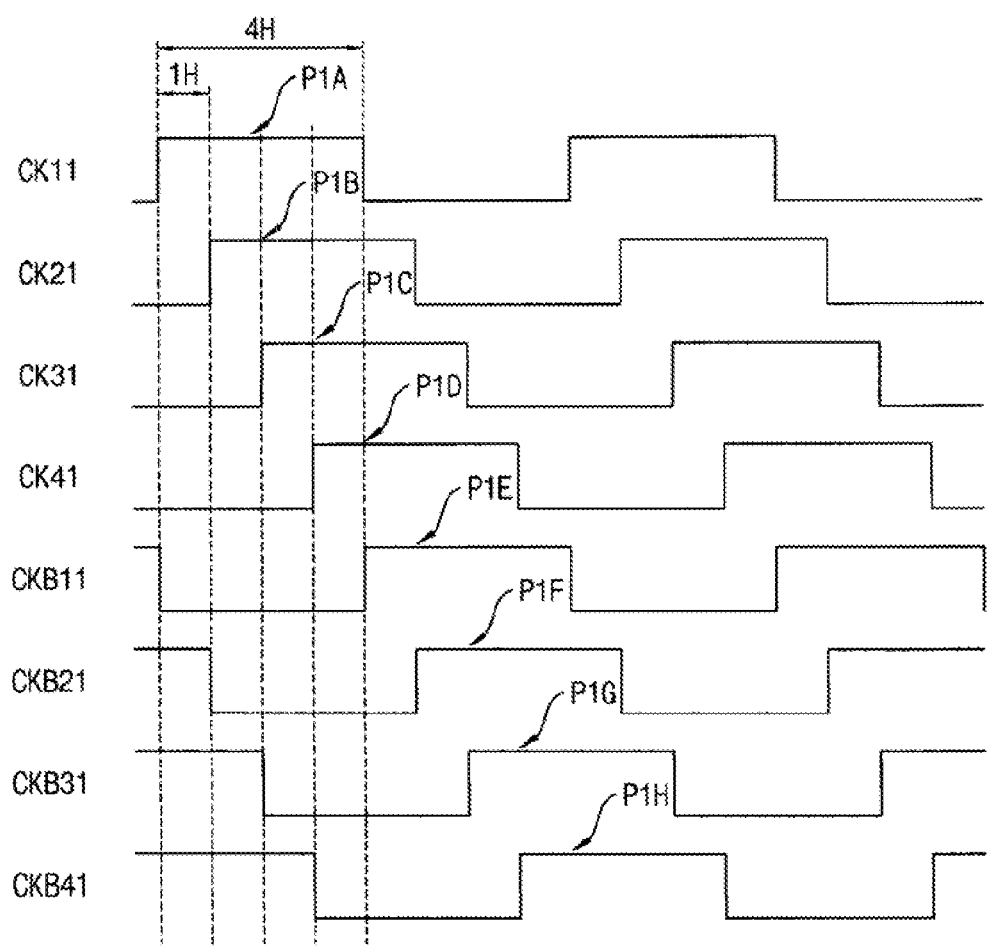

Referring to FIGS. 1, 2 and 3, the PMIC 500 included in the display apparatus 10 may generate four gate clock signals (e.g., first, second, third and fourth gate clock signals CK11, CK21, CK31 and CK41) and four inversion gate clock signals (e.g., first, second, third and fourth inversion gate clock signals CKB11, CKB21, CKB31 and CKB41). In other words, the display apparatus 10 may operate based on a quadruple gate clock driving scheme. Each of the inversion gate clock signals CKB11-CKB41 may have a phase opposite to that of a respective one of the gate clock signals CK11-CK41. For example, the first inversion gate clock signal CKB11 has a phase that is inverted with respect to a phase of the first gate clock signal CK11, the second inversion gate clock signal CKB21 has a phase that is inverted with respect to a phase of the second gate clock signal CK21, and the like.

A phase of one of the first through fourth gate clock signals CK11-CK41 may partially overlap a phase of another gate clock signal, from among the first through fourth gate clock signals CK11-CK41. Each of the first through fourth gate clock signals CK11-CK41 may have an ON level (e.g., an activation level) for four consecutive horizontal time periods 4H, and two adjacent gate clock signals may simultaneously have the ON level for three consecutive horizontal time periods. As illustrated in FIG. 3, the first gate clock signal CK11 may have the ON level during first through fourth horizontal time periods. The first horizontal time period may begin at a time corresponding to the first gate clock signal CK11 turning to the ON level, the second horizontal time period may begin when the first horizontal time period ends, the third horizontal time period may begin when the second horizontal time period ends, and the like. As shown in FIG. 3, 1H denotes one horizontal time period. The second gate clock signal CK21 may have the ON level during the second through fifth horizontal time periods, the third gate clock signal CK31 may have the ON level during the third through sixth horizontal time periods, and the fourth gate clock signal CK41 may have the ON level during fourth through seventh horizontal time periods. A horizontal time period, for example, a time period during which the first gate clock signal CK11 has the ON level overlaps a time period during which the second gate clock signal CK21 has the ON level. In other words, the first gate clock signal CK11 and the second gate clock signal CK21 have the ON level at the same time for a part of the time period during which each of the first and second gate clock signals CK11 and CK21 have the ON level. Referring to FIG. 3, this occurs during the second through fourth horizontal time periods. A time period during which the second gate clock signal CK21 has the ON level may overlap a time period during which the third gate clock signal CK31 has the ON level. This occurs during the third through fifth horizontal time periods. A time period during which the third gate clock signal CK31 has the ON level may overlap a time period during which the fourth gate clock signal CK41 has the ON level. This occurs during the fourth through sixth horizontal time periods. In addition, all of the gate clock signals CK11-CK41 may have the ON level during the fourth horizontal time period.

In an exemplary embodiment of the present invention, a difference between an OFF level (e.g., a low voltage level) of the gate clock signals CK11-CK41 and the ON level (e.g., a high voltage level) of the gate clock signals CK11-CK41 may be greater than about 10 Volts (V). For example, the OFF level may be about 0V, and the ON level may be about 10-40V.

Although not illustrated in FIG. 3, gate signals generated based on the gate clock signals CK11-CK41 and the inversion gate clock signals CKB11-CKB41 may have include pulses included in the gate clock signals CK11-CK41 and the inversion gate clock signals CKB11-CKB41, respectively. For example, each of first through eighth gate signals that are applied to first through eighth gate lines that are adjacent to each other may include a respective pulse, from among first through eighth pulses P1A, P1B, P1C, P1D, P1E, P1F, P1G, and P1H. In other words, referring to FIGS. 2 and 3, the first pulse P1A included in the first gate clock signal CK11 is applied to a first line 262a. The second pulse P1B included in the second gate clock signal CK21 is applied to a second line 262b. The third pulse P1C included in the third gate clock signal CK31 is applied to a third line 262c. The fourth pulse P1D included in the fourth gate clock signal CK41 is applied to a fourth line 262d. The fifth pulse P1E included in the first inversion gate clock signal CKB11 is applied to a fifth line 272a. The sixth pulse P1F included in the second inversion gate clock signal CKB21 is applied to a sixth line 272b. The seventh pulse P1G included in the third inversion gate clock signal CKB31 is applied to a seventh line 272c. The eighth pulse P1H included in the fourth inversion gate clock signal CKB41 is applied to an eighth line 272d.

Referring to FIG. 2, the PCB 250 on which the PMIC 500 is mounted may include an insulation layer 260, the first, second, third and fourth lines 262a, 262b, 262c and 262d, and the fifth, sixth, seventh and eighth lines 272a, 272b, 272c and 272d. The PCB 250 may further include a first solder resist layer 280 and a second solder resist layer 290.

The insulation layer 260 may include a resin material that has a high insulating property, heat resistance, moisture resistance, and the like. For example, the insulation layer 260 may include an epoxy resin, a phenol resin, a urethane resin, a silicon resin, a polyimide resin, or the like.

The first through fourth lines 262a-262d are formed on a first surface of the insulation layer 260. Each of the first through fourth lines 262a-262d may extend in the second direction D2. The first through fourth lines 262a-262d may be arranged in the first direction D1 and may be spaced apart from each other.

The fifth through eighth lines 272a-272d are formed on a second surface of the insulation layer 260 opposite to the first surface of the insulation layer 260. Like the first through fourth lines 262a-262d, each of the fifth through eighth lines 272a-272d may extend in the second direction D2. The fifth through eighth lines 272a-272d may be arranged in the first direction D1 and may be spaced apart from each other.

In an exemplary embodiment of the present invention, the fifth through eighth lines 272a-272d may be disposed on locations of the second surface of the insulation layer 260 that correspond to locations of the first surface of the insulation layer 260 on which the first through fourth lines 262a-262d are disposed, respectively. For example, the fifth line 272a may be disposed on a location of the second surface of the insulation layer 260 that corresponds to a location of the first surface of the insulation layer 260 on which the first line 262a is disposed. The sixth line 272b may be disposed on a location of the second surface of the insulation layer 260 that corresponds to a location of the first surface of the insulation layer 260 on which the second line 262b is disposed. The seventh line 272c may be disposed on a location of the second surface of the insulation layer 260 that corresponds to a location of the first surface of the insulation layer 260 on which the third line 262c is disposed. The eighth line 272d may be disposed on a location of the second surface of the insulation layer 260 that corresponds to a location of the first surface of the insulation layer 260 on which the fourth line 262d is disposed.

The first through fourth lines 262a-262d may transmit the first through fourth gate clock signals CK11-CK41, and the fifth through eighth lines 272a-272d may transmit the first through fourth inversion gate clock signals CKB11-CKB41.

A pair of lines that are symmetric with respect to the insulation layer 260 may transmit one of the gate clock signals CK11-CK41 and a respective inversion gate clock signal, from among the inversion gate clock signals CKB11-CKB41. For example, the first line 262a may transmit the first gate clock signal CK11 from the PMIC 500 to the gate driver 300, and the fifth line 272a may transmit the first inversion gate clock signal CKB11 from the PMIC 500 to the gate driver 300. The first line 262a and the fifth line 272a are symmetric about the insulation layer 260. The second line 262b may transmit the second gate clock signal CK21 from the PMIC 500 to the gate driver 300, and the sixth line 272b may transmit the second inversion gate clock signal CKB21 from the PMIC 500 to the gate driver 300. The second line 262b and the sixth line 272b are symmetric about the insulation layer 260. The third line 262c may transmit the third gate clock signal CK31 from the PMIC 500 to the gate driver 300, and the seventh line 272c may transmit the third inversion gate clock signal CKB31 from the PMIC 500 to the gate driver 300. The third line 262c and the seventh line 272c are symmetric about the insulation layer 260. The fourth line 262d may transmit the fourth gate clock signal CK41 from the PMIC 500 to the gate driver 300, and the eighth line 272d may transmit the fourth inversion gate clock signal CKB41 from the PMIC 500 to the gate driver 300. The fourth line 262d and the eighth line 272d are symmetric about the insulation layer 260.

In an exemplary embodiment of the present invention, a relationship between a signal line and a gate clock signal transmitted through the signal line can be changed. However, a gate clock signal and an inversion gate clock signal should be transmitted through a pair of lines that are symmetric with respect to the insulation layer 260.

As described above, one line of a pair of lines (e.g., the first line 262a) may be disposed on the insulation layer 260, and the other line of the pair of lines (e.g., the fifth line 272a) may be disposed under the insulation layer 260 such that the pair of lines are approximately completely overlapped with each other. A pair of differential gate clock signals (e.g., the first gate clock signal CK11 and the first inversion gate clock signal CKB11) may be transmitted through the pair of lines. A noise, such as an electro magnetic interference (EMI) noise, may be reduced by a coupling effect between the pair of lines. Accordingly, a size of the PCB 250 may decrease without distorting the transmitted signal even when a width d1 of a single line of a pair of approximately completely overlapped lines is not decreased in comparison with that of a single line in a conventional PCB.

The first solder resist layer 280 may be formed on the first surface of the insulation layer 260 on which the first through fourth lines 262a-262d are formed. The second solder resist layer 290 may be formed on the second surface of the insulation layer 260 on which the fifth through eighth lines 272a-272d are formed. The lines 262a-262d and 272a-272d may be protected by the solder resist layers 280 and 290.

In an exemplary embodiment of the present invention, a ground layer between the second surface of the insulation layer 260 and the fifth through eighth lines 272a-272d may be omitted in the PCB 250. In the PCB 250, according to an exemplary embodiment of the present invention, the ground layer may be replaced with a signal line layer including the fifth through eighth lines 272a-272d.

Although not illustrated in FIG. 2, the PCB 250 may further include a line for transmitting the vertical start signal. In an exemplary embodiment of the present invention, the line for transmitting the vertical start signal may be formed on the first surface of the insulation layer 260 and may be spaced apart from the first through fourth lines 262a-262d. In an exemplary embodiment of the present invention, the line for transmitting the vertical start signal may be formed on the second surface of the insulation layer 260 and may be spaced apart from the fifth through eighth lines 272a-272d.

Figure 4:
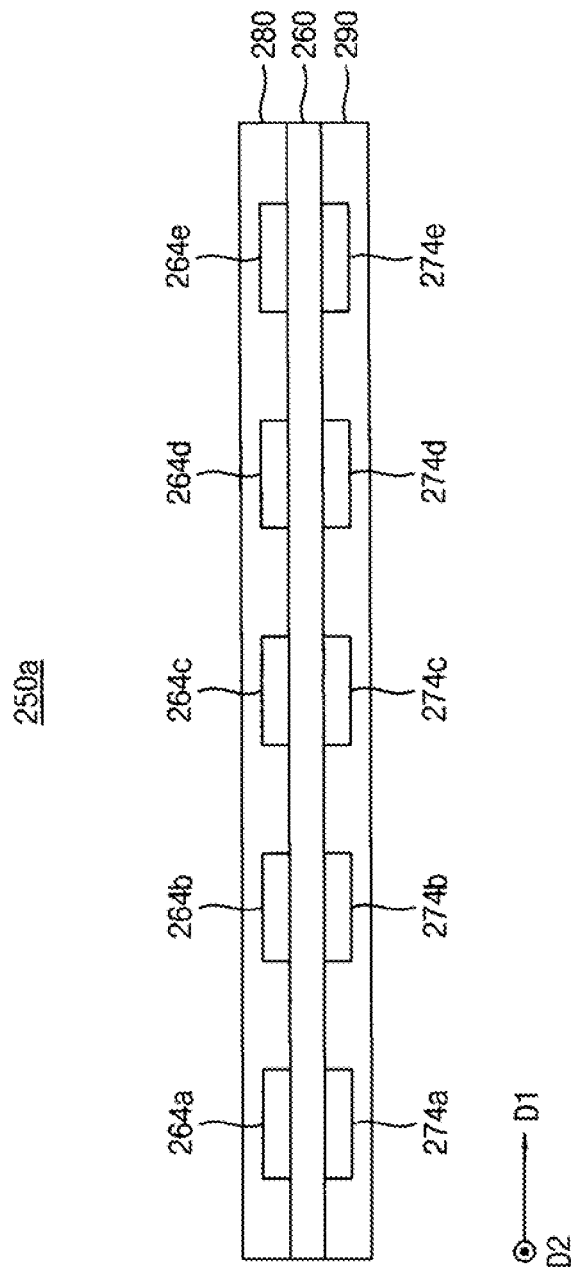
Figure 5:
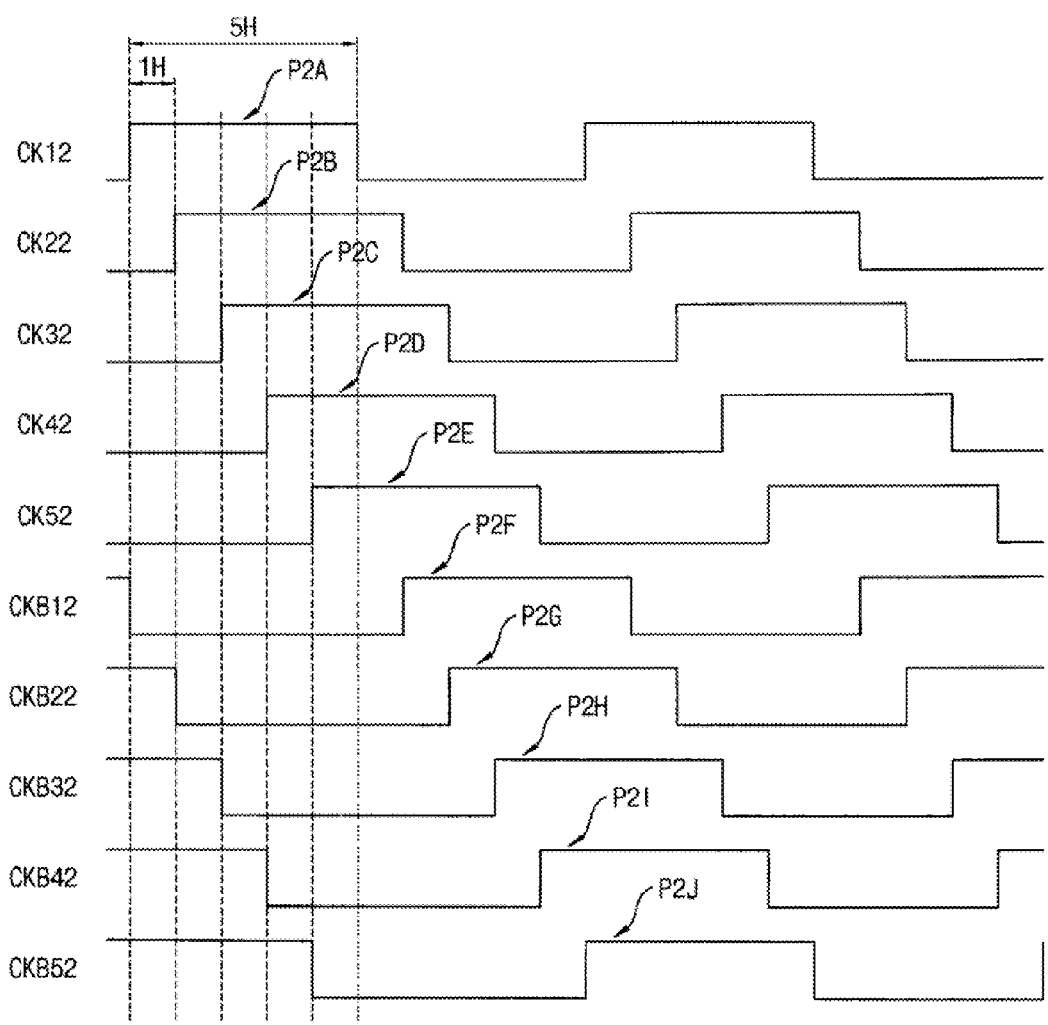

Referring to FIGS. 1, 4 and 5, the PMIC 500 included in the display apparatus 10 may generate five gate clock signals (e.g., first, second, third, fourth and fifth gate clock signals CK12, CK22, CK32, CK42 and CK52) and five inversion gate clock signals (e.g., first, second, third, fourth and fifth inversion gate clock signals CKB12, CKB22, CKB32, CKB42 and CKB52). Each of the inversion gate clock signals CKB12-CKB52 may have a phase opposite to that of a respective one of the gate clock signals CK12-CK52.

A phase of one of the first through fifth gate clock signals CK12-CK52 may partially overlap a phase of another gate clock signal, from among of the first through fifth gate clock signals CK12-CK52. For example, each of the first through fifth gate clock signals CK12-CK52 may have the ON level for five consecutive horizontal time periods 511, and two adjacent gate clock signals (e.g., the first and second gate clock signals CK12 and CK22) may simultaneously have the ON level for four consecutive horizontal time periods. Gate signals generated based on the gate clock signals CK12-CK52 and the inversion gate clock signals CKB12-CKB52 may include one of pulses for example, first through tenth pulses P2A, P2B, P2C, P2D, P2E, P2F, P2G, P2H, P2I and P2J, respectively. The first through tenth pulses P2A, P2B, P2C, P2D, P2E, P2F, P2G, P2H, P2I and P2J may be included in the gate clock signals CK12-CK52 and the inversion gate clock signals CKB12-CKB52, respectively.

Referring to FIG. 4, a PCB 250a on which the PMIC 500 is mounted may include an insulation layer 260, first, second, third, fourth and fifth lines 264a, 264b, 264c, 264d and 264e, and sixth, seventh, eighth, ninth and tenth lines 274a, 274b, 274c, 274d and 274e. The PCB 250a may further include a first solder resist layer 280 and a second solder resist layer 290.

The first through fifth lines 264a-264e are formed on a first surface of the insulation layer 260. The sixth through tenth lines 274a-274e are formed on a second surface of the insulation layer 260 opposite to the first surface of the insulation layer 260. The sixth through tenth lines 274a-274e may be disposed on locations of the second surface of the insulation layer 260 that correspond to locations of the first surface of the insulation layer 260 on which the first through fifth lines 264a-264e are disposed, respectively. The first through fifth lines 264a-264e may transmit the first through fifth gate clock signals CK12-CK52, and the sixth through tenth lines 274a-274e may transmit the first through fifth inversion gate clock signals CKB12-CKB52. A pair of lines that are symmetric with respect to the insulation layer 260 may transmit a gate clock signal, from among the gate clock signals CK12-CK52 and a respective inversion gate clock signal, from among the inversion gate clock signals CKB12-CKB52. For example, the pair of lines may be the first gate line 264a and the sixth gate line 274a. The first gate line 264a may transmit the gate clock signal CK12 and the sixth gate line 274a may transmit the inversion gate clock signal CKB12.

Figure 6:
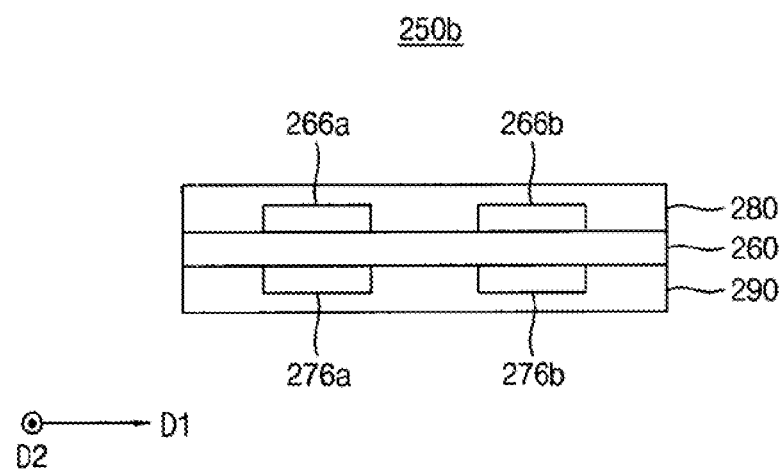
Figure 7:
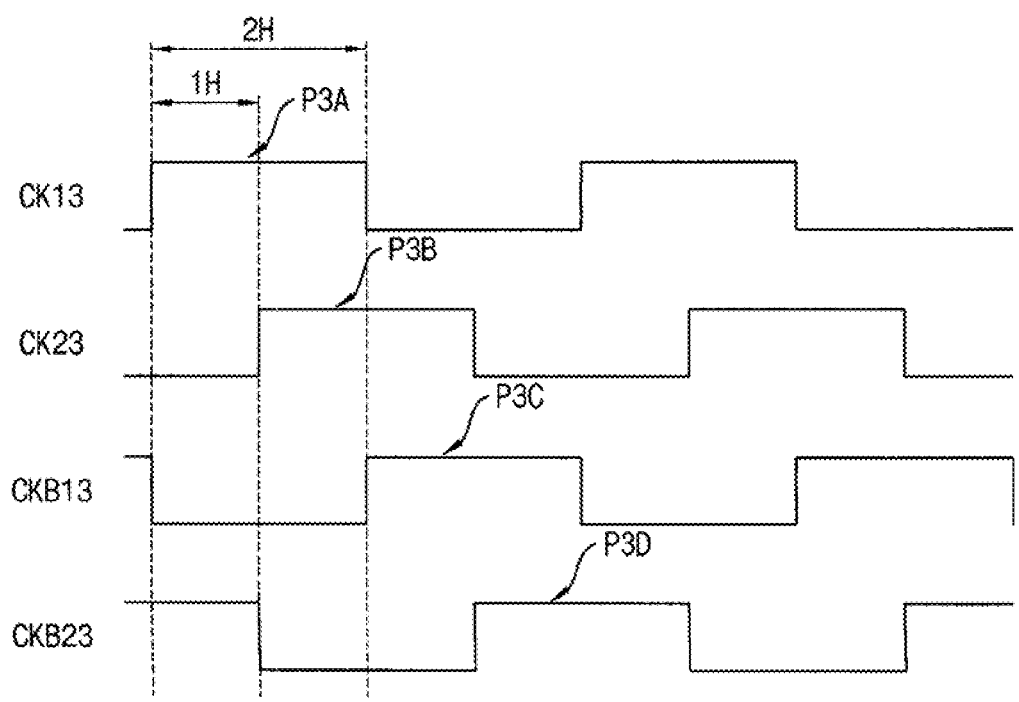

Referring to FIGS. 1, 6 and 7, the PMIC 500 included in the display apparatus 10 may generate two gate clock signals (e.g., first and second gate clock signals CK13 and CK23) and two inversion gate clock signals (e.g., first and second inversion gate clock signals CKB13 and CKB23). In other words, the display apparatus 10 may operate based on a dual gate clock driving scheme. Each of the first and second inversion gate clock signals CKB13 and CKB23 may have a phase opposite to that of a respective gate clock signal, from among the first and second gate clock signals CK13 and CK23. In other words, the first inversion gate clock signal CKB13 has a phase that is inverted with respect to the first gate clock signal CK13, and the second inversion gate clock signal CKB23 has a phase that is inverted with respect to a phase of the second gate clock signal CK23.

A phase of one of the first and second gate clock signals CK13 and CK23 may partially overlap a phase of another gate clock signal, from among the first and second gate clock signals CK13 and CK23. In other words, a phase of the first gate clock signal CK13 partially overlaps a phase of the second gate clock signal CK23. For example, each of the first and second gate clock signals CK13 and CK23 may have the ON level for two consecutive horizontal time periods 2H, and the first and second gate clock signals CK13 and CK23 may simultaneously have the ON level for one horizontal time period 1H. Gate signals generated based on the first and second gate clock signals CK13 and CK23 and the first and second inversion gate clock signals CKB13 and CKB23 may include pulses included in the first and second gate clock signals CK13 and CK23 and the first and second inversion gate clock signals CKB13 and CKB23. For example, the gate signal generated based on the first gate clock signal CK13 includes the pulse P3A. The gate signal generated based on the second gate clock signal CK23 includes the pulse P3B. The gate signal generated based on the first inversion gate clock signal CKB13 includes the pulse P3C. The gate signal generated based on the second inversion gate clock signal CKB23 includes the pulse P3D.

Referring to FIG. 6, a PCB 250b on which the PMIC 500 is mounted may include an insulation layer 260, first and second lines 266a and 266b, and third and fourth lines 276a and 276b. The PCB 250b may further include a first solder resist layer 280 and a second solder resist layer 290.

The first and second lines 266a and 266b are formed on a first surface of the insulation layer 260. The third and fourth lines 276a and 276b are formed on locations of the second surface of the insulation layer 260 that correspond to locations of the first surface of the insulation layer 260 on which the first and second lines 266a and 266b are formed, respectively. In other words, the third line 276a is disposed on a location of the second surface of the insulation layer 260 that corresponds to the location of the first surface of the insulation layer 260 on which the first line 266a is disposed. The fourth line 276b is disposed on a location of the second surface of the insulation layer 260 that corresponds to the location of the first surface of the insulation layer 260 on which the second line 266b is disposed. The first and third lines 266a and 276a are symmetric about the insulation layer 260. The second and fourth lines 266b and 276b are symmetric about the insulation layer 260. The first and second lines 266a and 266b may transmit the first and second gate clock signals CK13 and CK23, respectively. The third and fourth lines 276a and 276b may transmit the first and second inversion gate clock signals CKB13 and CKB23, respectively. A pair of lines that are symmetric with respect to the insulation layer 260 may transmit a gate clock signal, from among the gate clock signals CK13 and CK23 and a respective inversion gate clock signal, from among the inversion gate clock signals CKB13 and CKB23. For example, the first line 266a may transmit the first gate clock signal CK13 and the third line 276a may transmit the first inversion gate clock signal CKB13. The second line 266b may transmit the second gate clock signal CK23 and the fourth line 276b may transmit the second inversion gate clock signal CKB23.

Figure 8:
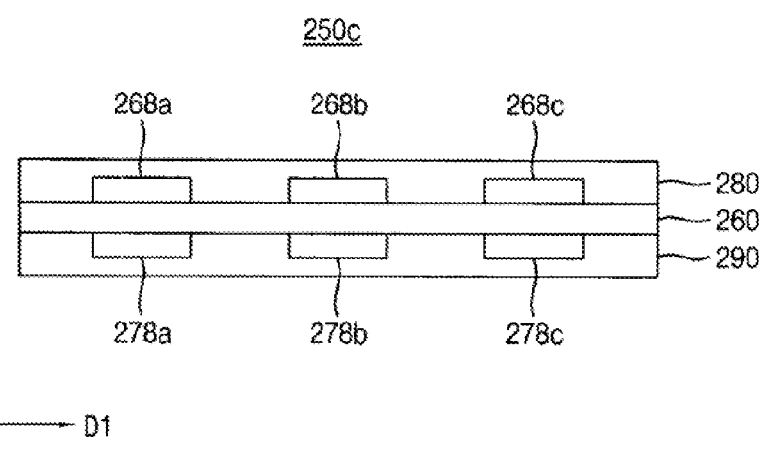
Figure 9:
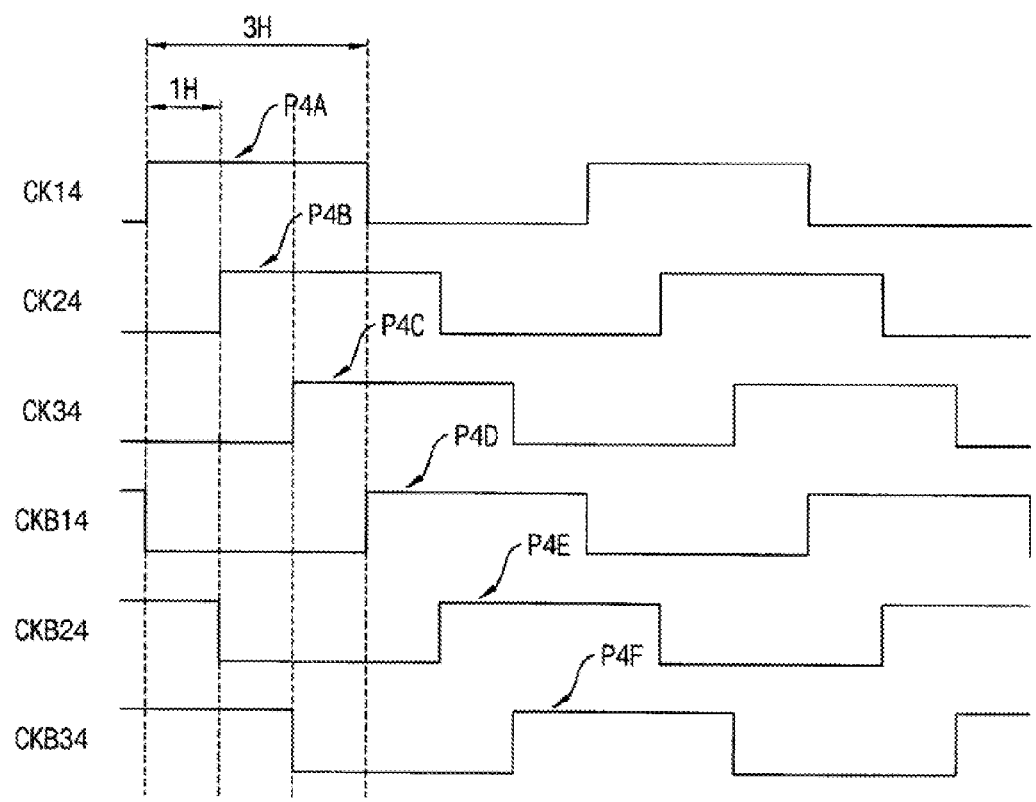

Referring to FIGS. 1, 8 and 9, the PMIC 500 included in the display apparatus 10 may generate three gate clock signals, for example, first, second and third gate clock signals CK14, CK24 and CK34, and three inversion gate clock signals, for example, first, second and third inversion gate clock signals CKB14, CKB24 and CKB34. Each of the inversion gate clock signals CKB14-CKB34 may have a phase opposite to that of a gate clock signal, from among the gate clock signals CK14-CK34. In other words, the first inversion gate clock signal CKB14 has a phase that is inverted with respect to a phase of the first gate clock signal CK14. The second inversion gate clock signal CKB24 has a phase that is inverted with respect to a phase of the second gate clock signal CK24. The third inversion gate clock signal CKB34 has a phase that is inverted with respect to a phase of the third gate clock signal CK34.

A phase of one of the first through third gate clock signals CK14-CK34 may partially overlap a phase of another gate clock signal, from among the first through third gate clock signals CK14-CK34. For example, each of the first through third gate clock signals CK14-CK34 may have the ON level for three consecutive horizontal time periods 3H. Two adjacent gate clock signals, for example, the first and second gate clock signals CK14 and CK24, may simultaneously have the ON level for two consecutive horizontal time periods. Each horizontal time period is 1H long. Gate signals generated based on the gate clock signals CK14-CK34 and the inversion gate clock signals CKB14-CKB34 may include pulses included in the gate clock signals CK14-CK34 and the inversion gate clock signals CKB14-CKB34, respectively. For example, the gate signal generated based on the first gate clock signal CK14 includes the pulse P4A. The gate signal generated based on the second gate clock signal CK24 includes the pulse P4B. The gate signal generated based on the third gate clock signal CK34 includes the pulse P4C. The gate signal generated based on the first inversion gate clock signal CKB14 includes the pulse P4D. The gate signal generated based on the second inversion gate clock signal CKB24 includes the pulse P4E. The gate signal generated based on the third inversion gate clock signal CKB34 includes the pulse P4F.

Referring to FIG. 8, a PCB 250c on which the PMIC 500 is mounted may include an insulation layer 260, first, second and third lines 268a, 268b and 268c, and fourth, fifth and sixth lines 278a, 278b and 278c. The PCB 250c may further include a first solder resist layer 280 and a second solder resist layer 290.

The first through third lines 268a-268c are formed on a first surface of the insulation layer 260. The fourth through sixth lines 278a-278c are formed on locations of the second surface of the insulation layer 260 that correspond to locations of the first surface of the insulation layer 260 on which the first through third lines 268a-268c are formed, respectively. The first through third lines 268a-268c may transmit the first through third gate clock signals CK14-CK34, respectively, and the fourth through sixth lines 278a-278c may transmit the first through third inversion gate clock signals CKB14-CKB34, respectively. A pair of lines that are symmetric with respect to the insulation layer 260 may transmit a the gate clock signal, from among the gate clock signals CK14-CK34 and a respective inversion gate clock signal, from among the inversion gate clock signals CKB14-CKB34. For example, the pair of first and fourth lines 268a and 278a are symmetric about the insulation layer 260. The first line 268a may transmit the first gate clock signal CK14 and the fourth line 278a may transmit the first inversion gate clock signal CKB14. The pair of second and fifth lines 268b and 278b are symmetric about the insulation layer 260. The second line 268b may transmit the second gate clock signal CK24 and the fifth line 278b may transmit the second inversion gate clock signal CKB24. The pair of third and sixth lines 268c and 278c are symmetric about the insulation layer 260. The third line 268c may transmit the third gate clock signal CK34 and the sixth line 278c may transmit the third inversion gate clock signal CKB34.

Although the structures including the signal lines and the gate clock signals transmitted through the structures are described based on the examples where the PMIC 500 generates two, three, four and five gate clock signals (e.g., based on FIGS. 2, 3, 4, 5, 6, 7, 8 and 9), the PMIC 500 may generate any number (e.g., six, seven, eight, to Nth, N being a positive nonzero integer) of the gate clock signals, and the structures and the gate clock signals may be changed depending on the number of the gate clock signals.

Figure 10:
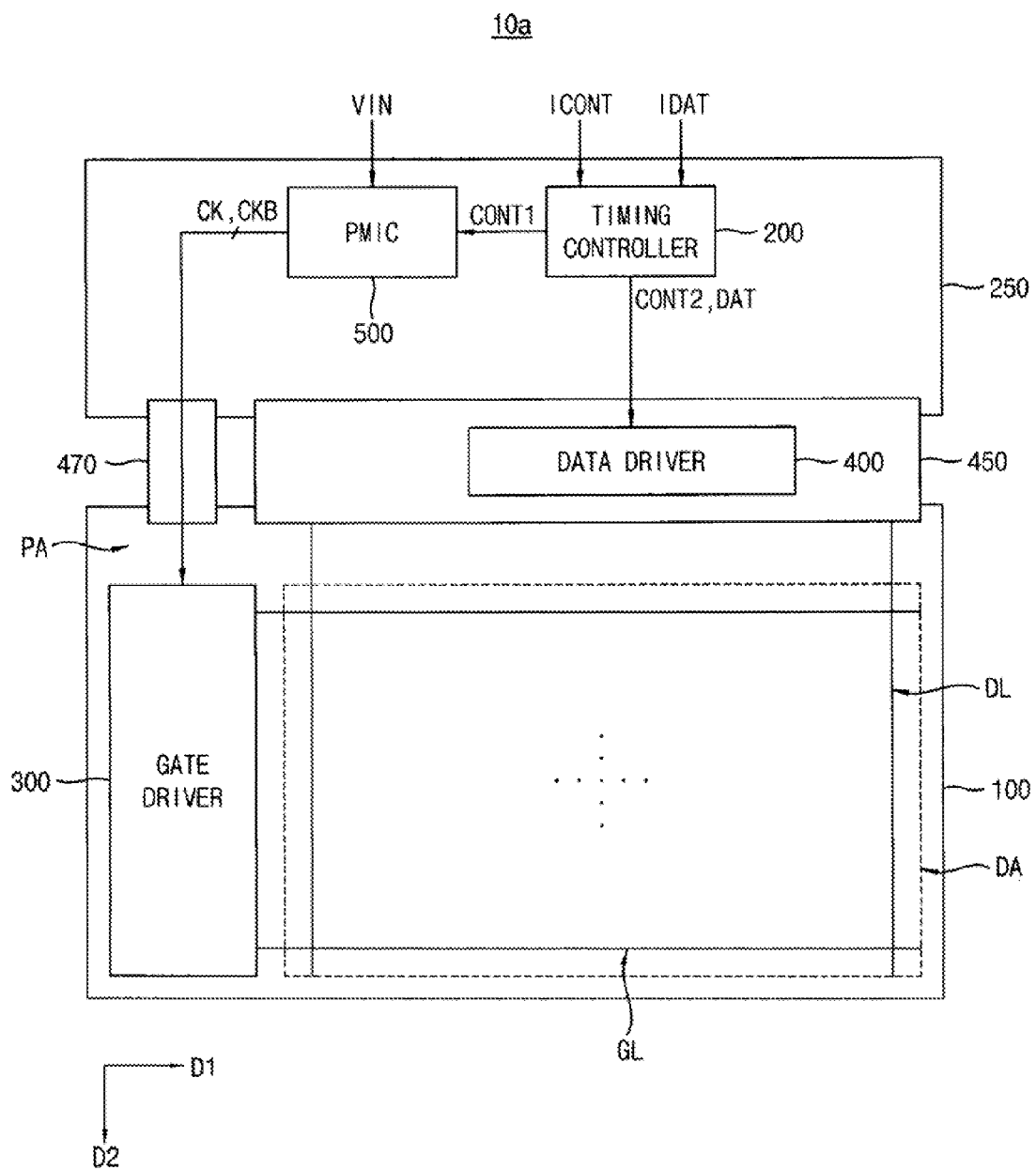
FIG. 10 is a block diagram illustrating a display apparatus according to an exemplary embodiment of the present invention.
Figure 11:
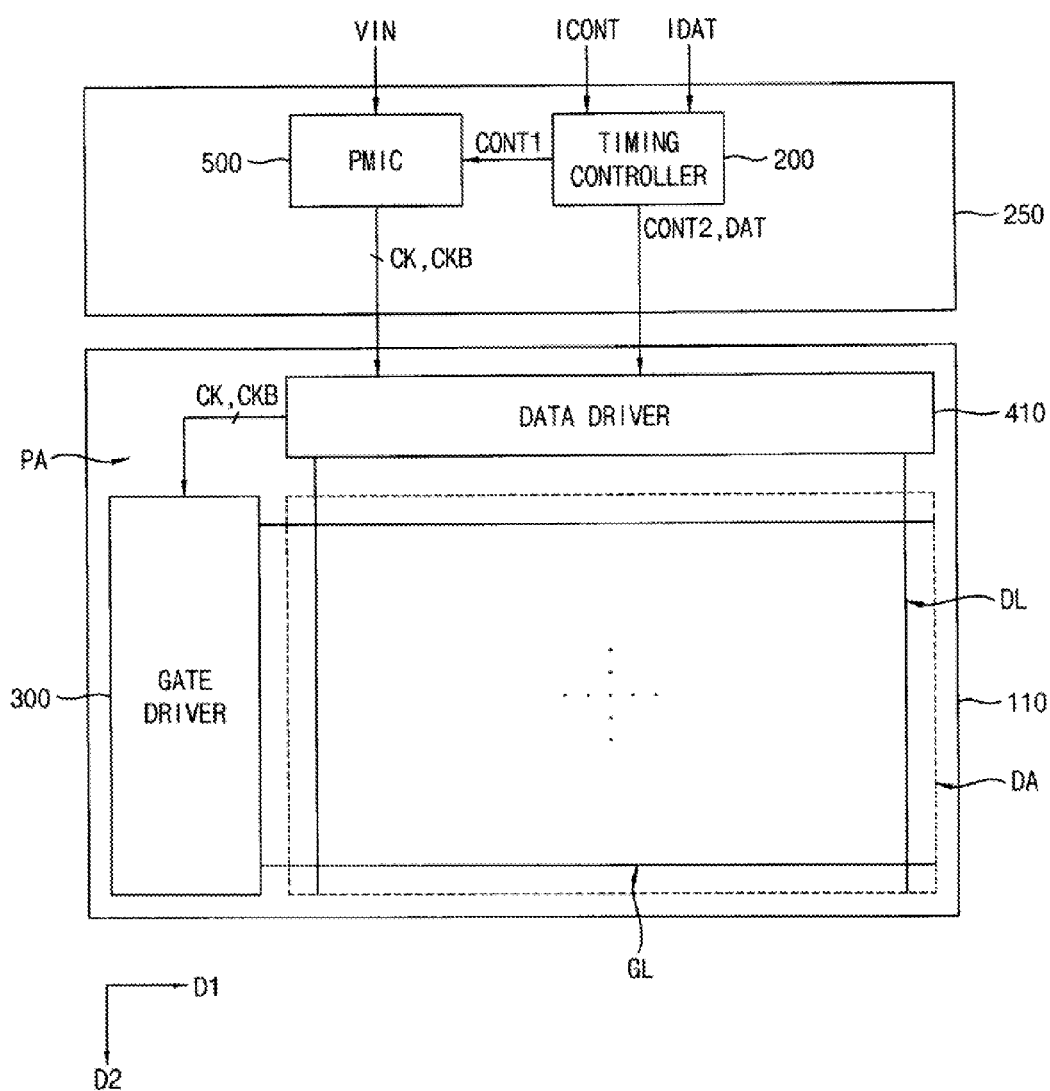
FIG. 11 is a block diagram illustrating a display apparatus according to an exemplary embodiment of the present invention.

FIG. 10 is a block diagram illustrating a display apparatus according to an exemplary embodiment of the present invention. FIG. 11 is a block diagram illustrating a display apparatus according to an exemplary embodiment of the present invention.

Referring to FIG. 10, a display apparatus 10a includes a display panel 100, a timing controller 200, a PCB 250, a gate driver 300, a data driver 400, a first FPCB 450, a second FPCB 470 and a PMIC 500.

The display apparatus 10a of FIG. 10 may be substantially the same as the display apparatus 10 of FIG. 1, except that the display apparatus 10a further includes the second FPCB 470 separate from the first FPCB 450.

Like the first FPCB 450, the second FPCB 470 may electrically connect the PCB 250 with the display panel 100. For example, the second FPCB 470 may be disposed adjacent to the gate driver 300. The gate driver 300 is integrated in the display panel 100.

In the display apparatus 10a, according to an exemplary embodiment of the present invention, the PMIC 500 may generate at least two gate clock signals CK such that a phase of one of the gate clock signals CK partially overlaps a phase of another gate clock signal CK. The gate clock signals CK and the inversion gate clock signals CKB may be provided from the PMIC 500 to the gate driver 300 through a plurality of lines disposed in the PCB 250 and a plurality of lines disposed in the second FPCB 470.

Referring to FIG. 11, a display apparatus 20 includes a display panel 110, a timing controller 200, a PCB 250, a gate driver 300, a data driver 410 and a PMIC 500.

The display apparatus 20 of FIG. 11 may be substantially the same as the display apparatus 10 of FIG. 1, except that structures and arrangements of the data driver 410 and the display panel 110 in the display apparatus 20 are changed.

Like the gate driver 300, the data driver 410 may be integrated in the display panel 110. For example, the gate driver 300 and the data driver 410 may be disposed in the peripheral region PA of the display panel 110. The gate driver 300 may be adjacent to a first side (e.g., a short side on the left) of the display panel 110, and the data driver 410 may be adjacent to a second side (e.g., a long side) of the display panel 110 crossing the first side of the display panel 110.

In the display apparatus 20, according to an exemplary embodiment of the present invention, the PMIC 500 may generate at least two gate clock signals CK such that a phase of one of the gate clock signals CK partially overlaps a phase of another gate clock signal CK. The gate clock signals CK and the inversion gate clock signals CKB may be provided from the PMIC 500 to the gate driver 300 through a plurality of lines disposed in the PCB 250 and the data driver 410.

Although not illustrated in FIG. 11, the display apparatus 20 may include at least one FPCB that connects the PCB 250 with the display panel 110.

Figure 12:
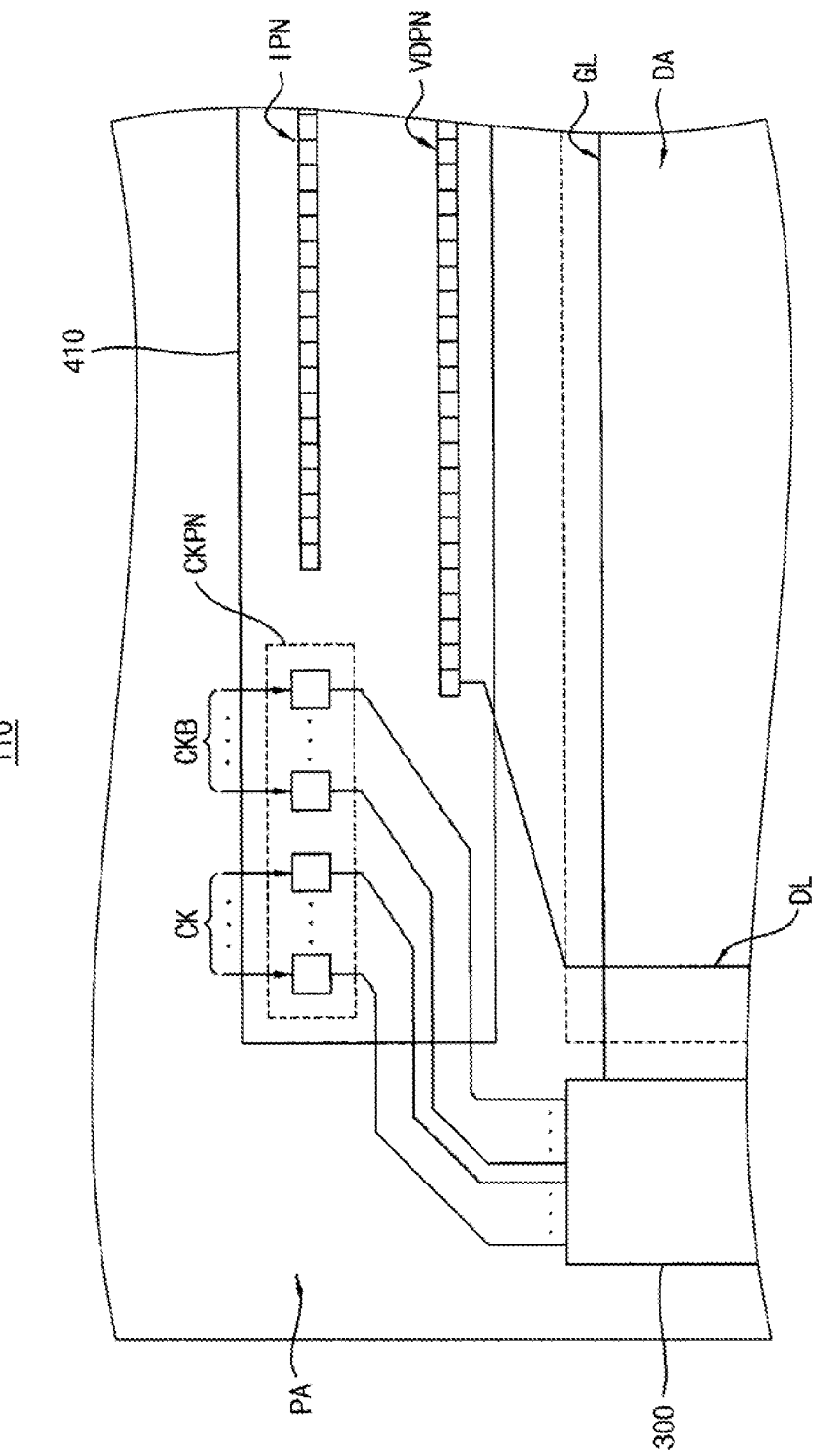
FIG. 12 is a diagram illustrating a display panel and a data driver included in the display apparatus of FIG. 11, according to an exemplary embodiment of the present invention.

FIG. 12 is a diagram illustrating a display panel and a data driver included in the display apparatus of FIG. 11, according to an exemplary embodiment of the present invention.

Referring to FIGS. 11 and 12, the data driver 410 integrated in the peripheral region PA of the display panel 110 may include a plurality of input pins IPN, a plurality of data voltage output pins VDPN and a plurality of clock pins CKPN. For convenience of illustration, elements for generating data voltages in the data driver 410 are not illustrated in FIG. 12.

The data driver 410 may receive the second control signal CONT2 and the output image data DAT from the timing controller 200 through the plurality of input pins IPN. The data driver 410 may apply the data voltages to the display region DA of the display panel 110 through the plurality of data voltage output pins VDPN. The data driver 410 may receive the gate clock signals CK and the inversion gate clock signals CKB from the PMIC through the plurality of clock pins CKPN and may provide the received gate clock signals CK and the received inversion gate clock signals CKB to the gate driver 300.

Figure 13:
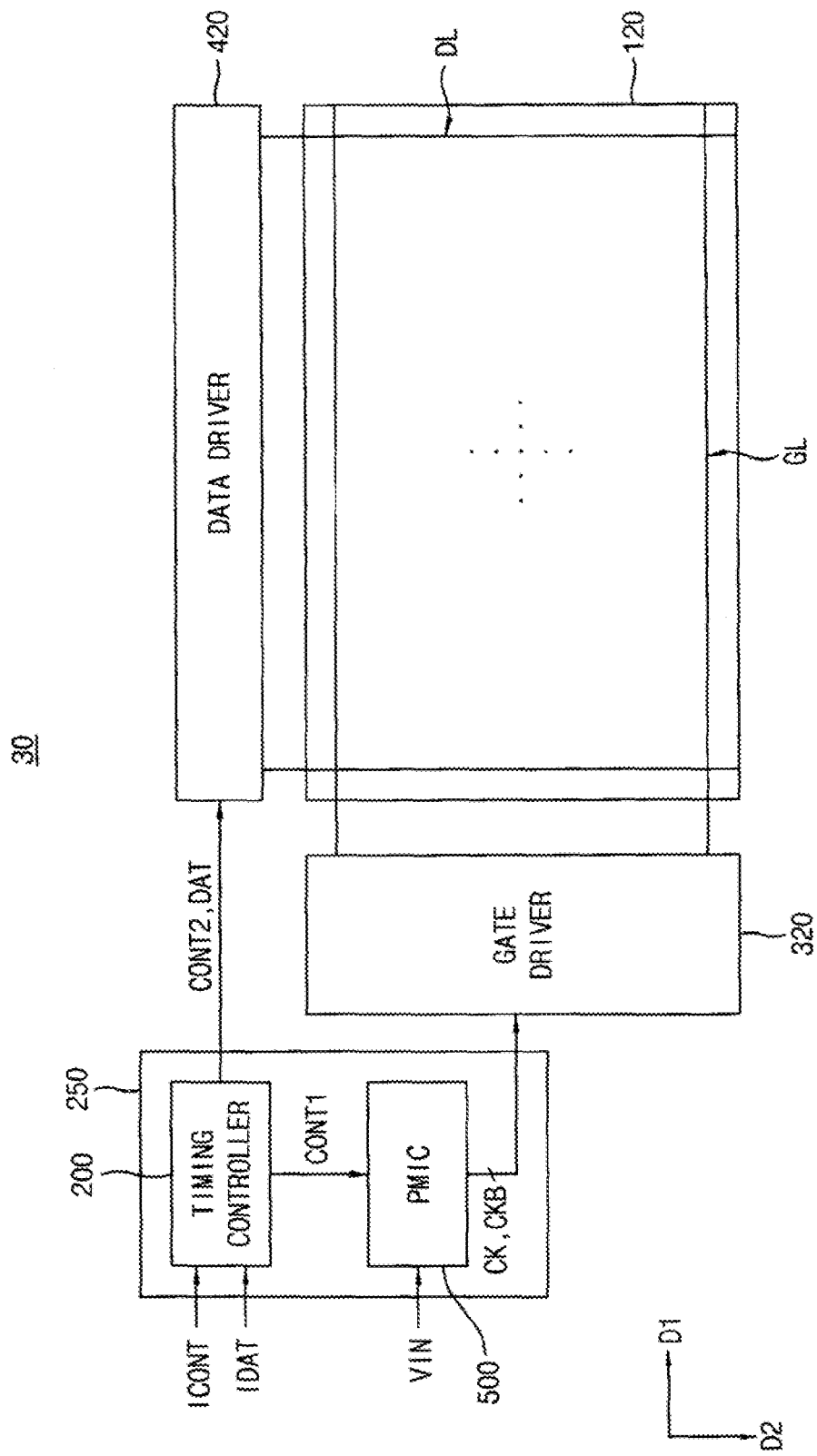
FIG. 13 is a block diagram illustrating a display apparatus according to an exemplary embodiment of the present invention.
Figure 14:
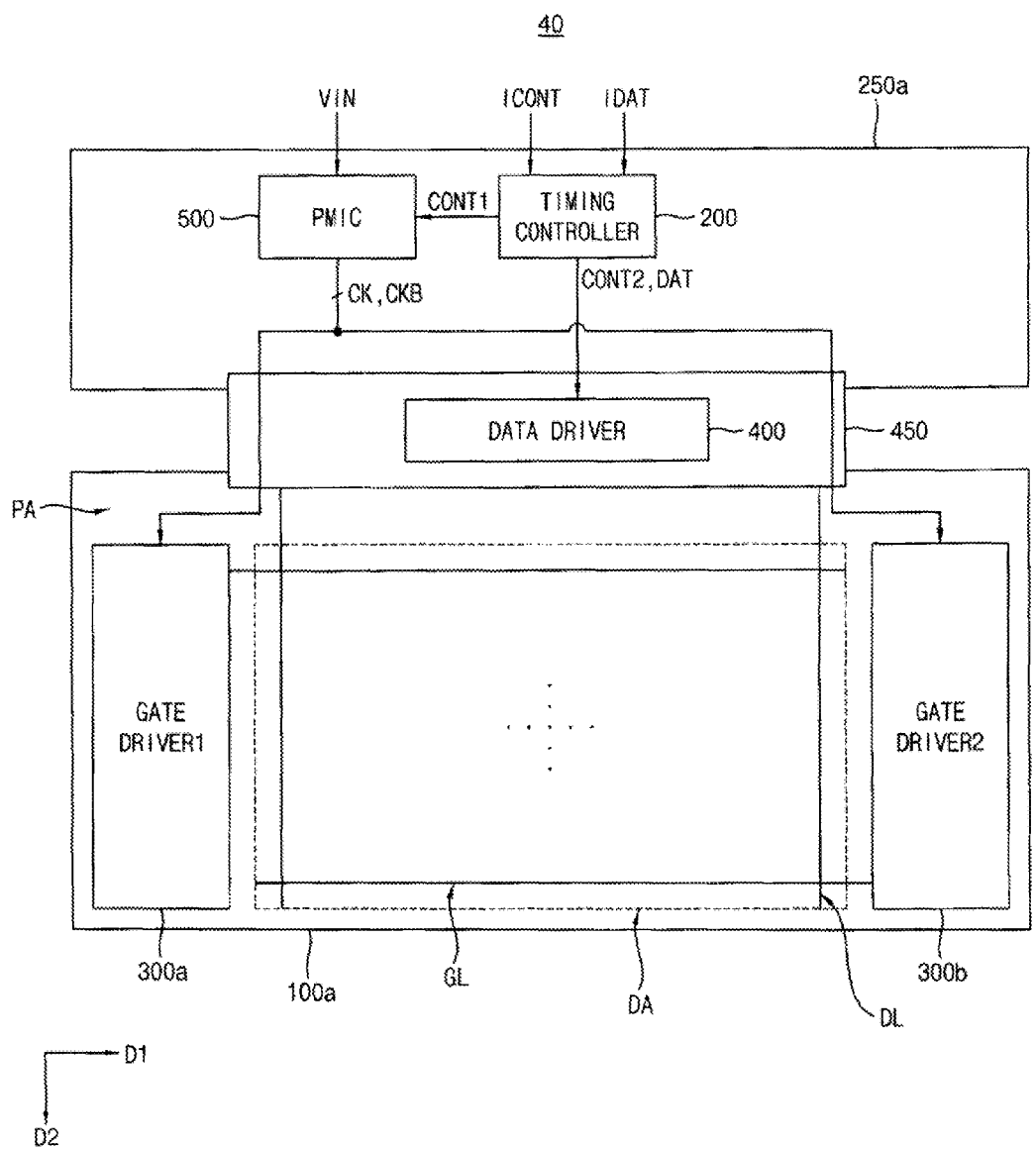
FIG. 14 is a block diagram illustrating a display apparatus according to an exemplary embodiment of the present invention.

FIG. 13 is a block diagram illustrating a display apparatus according to an exemplary embodiment of the present invention. FIG. 14 is a block diagram illustrating a display apparatus according to an exemplary embodiment of the present invention.

Referring to FIG. 13, a display apparatus 30 includes a display panel 120, a timing controller 200, a PCB 250, a gate driver 320, a data driver 420 and a PMIC 500.

The display apparatus 30 of FIG. 13 may be substantially the same as the display apparatus 10 of FIG. 1, except that structures and arrangements of the gate driver 320, the data driver 420 and the display panel 120 in the display apparatus 30 are changed.

The gate driver 320 and/or the data driver 420 may be not integrated in the display panel 120 and may be separate from the display panel 120.

In the display apparatus 30, according to an exemplary embodiment of the present invention, the PMIC 500 may generate at least two gate clock signals CK such that a phase of one of the gate clock signals CK partially overlaps a phase of another gate clock signal CK. The gate clock signals CK and the inversion gate clock signals CKB may be provided from the PMIC 500 to the gate driver 320 through a plurality of lines in the PCB 250.

Referring to FIG. 14, a display apparatus 40 includes a display panel 100a, a timing controller 200, a PCB 250a, a first gate driver 300a, a second gate driver 300b, a data driver 400, an FPCB 450 and a PMIC 500.

The display apparatus 40 of FIG. 14 may be substantially the same as the display apparatus 10 of FIG. 1, except that the display apparatus 40 includes two gate drivers 300a and 300b, and structures and arrangements of the display panel 100a and the PCB 250a in the display apparatus 40 are changed.

The gate drivers 300a and 300b may be integrated in the display panel 100a. For example, the gate drivers 300a and 300b may be disposed in the peripheral region PA of the display panel 100a. The first gate driver 300a may be adjacent to a first side (e.g., a short side on the left) of the display panel 100a, and the second gate driver 300b may be adjacent to a third side (e.g., a short side on the right) of the display panel 100a opposite to the first side of the display panel 100a. Some gate lines GL may be connected to the first gate driver 300a, and other gate lines GL may be connected to the second gate driver 300b.

In the display apparatus 40, according to an exemplary embodiment of the present invention, the PMIC 500 may generate at least two gate clock signals CK such that a phase of one of the gate clock signals CK partially overlaps a phase of another gate clock signal CK. The gate clock signals CK and the inversion gate clock signals CKB may be provided from the PMIC 500 to the gate drivers 300a and 300b through a plurality of lines disposed in the PCB 250a and a plurality of lines disposed in the FPCB 450.

Although not illustrated in FIGS. 10, 11 and 13, at least one of the display apparatus 10a, the display apparatus 20 and the display apparatus 30 may include two gate drivers.

Figure 15:
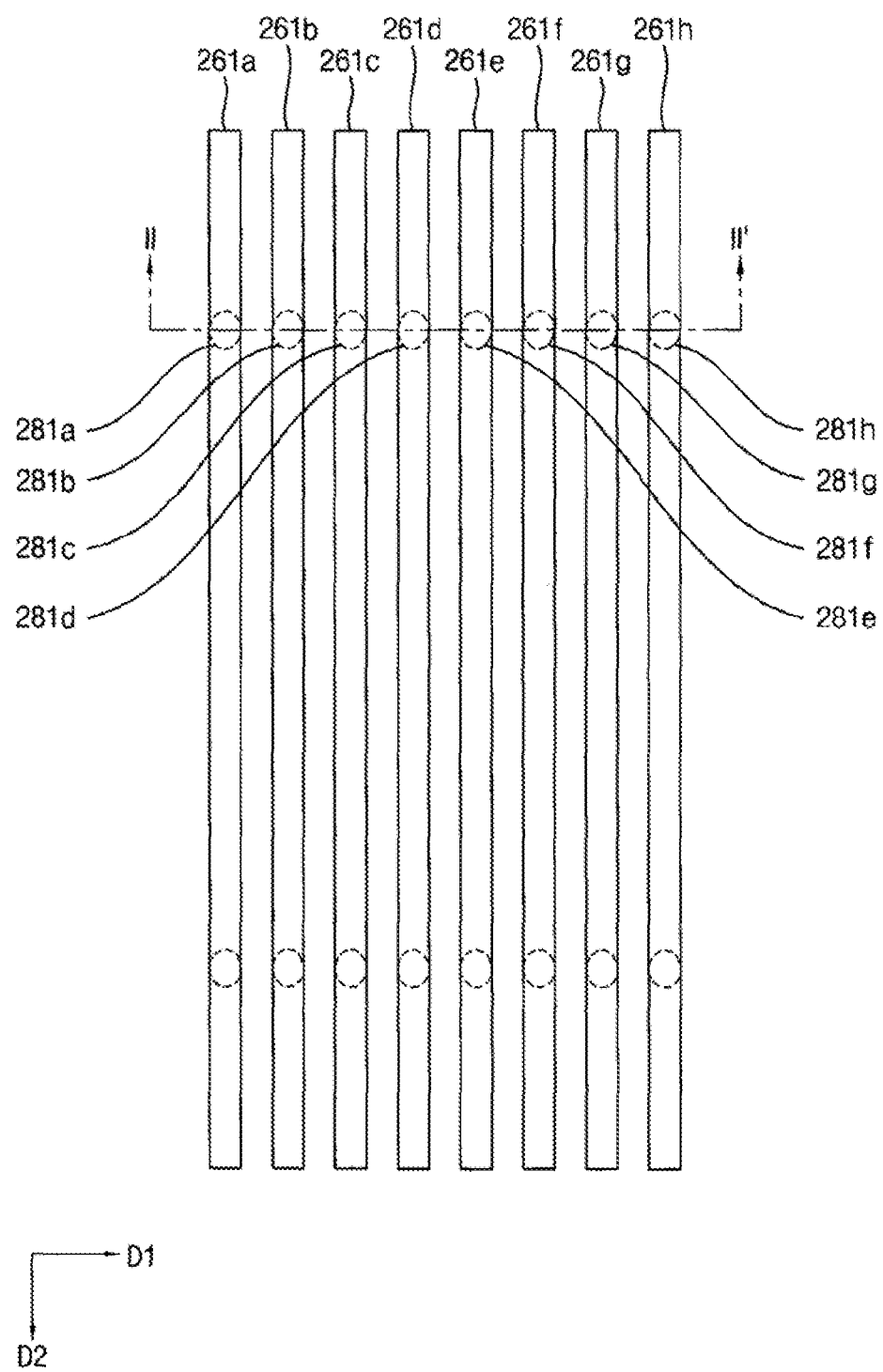
FIGS. 15, 16, 17, 18 and 19 are diagrams illustrating a display apparatus according to exemplary embodiments of the present invention.
Figure 16:
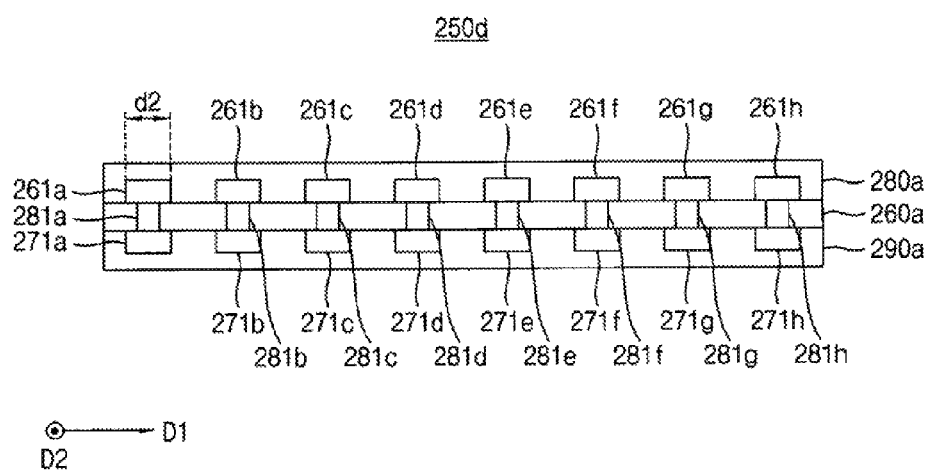
Figure 17:
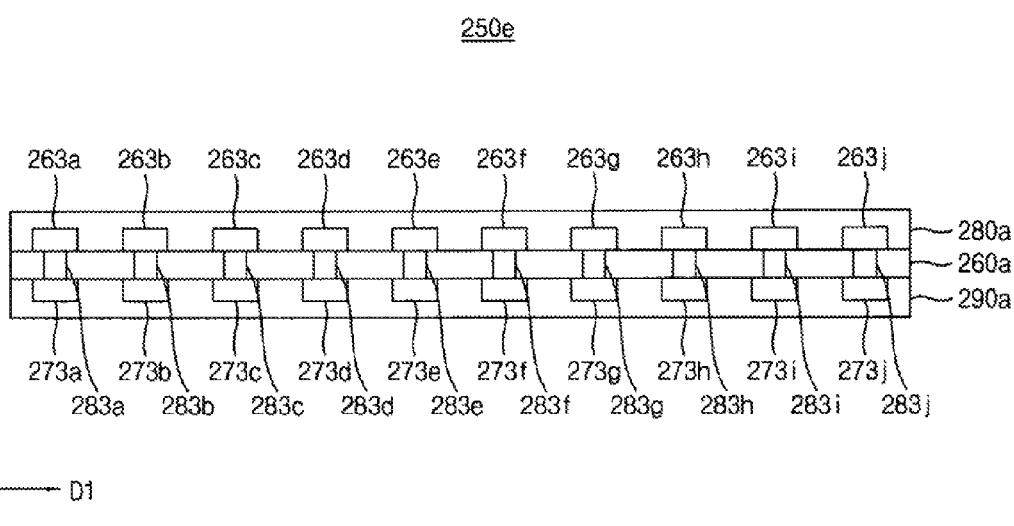
Figure 18:
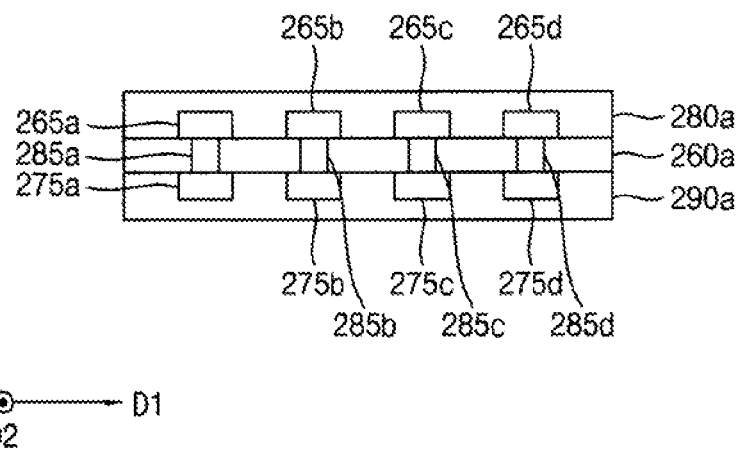
Figure 19:
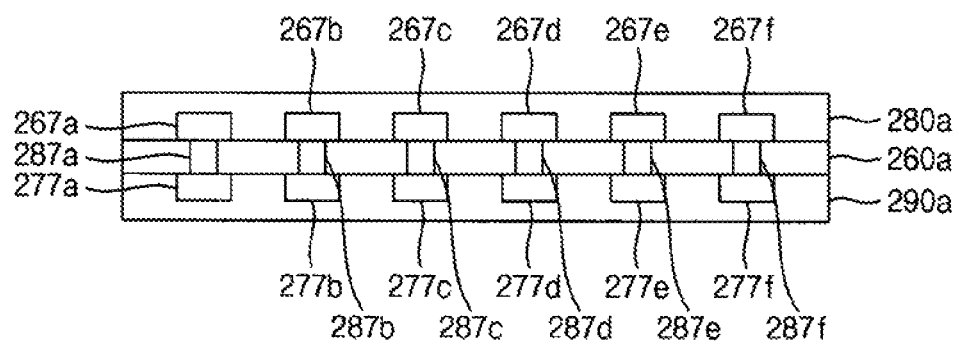

FIGS. 15, 16, 17, 18 and 19 are diagrams illustrating a display apparatus according to exemplary embodiments of the present invention. FIG. 15 is a plan view of a PCB of a display apparatus and illustrates an example of a structure including signal lines for transmitting the gate clock signals. FIG. 16 is a cross-sectional view of the PCB of the display apparatus illustrated in FIG. 15, taken along line II-II' of FIG. 15. In addition, FIG. 16 is a cross-sectional view of the PCB of the display apparatus illustrated in FIG. 1, taken along line I-I' of FIG. 1. FIGS. 17, 18 and 19 are cross-sectional views of the PCB in the display apparatus taken along line I-I' of FIG. 1. FIGS. 17, 18 and 19 illustrate examples of structures including signal lines for transmitting gate clock signals.

Referring to FIGS. 3, 15 and 16, a PCB 250d on which the PMIC 500 is mounted may include an insulation layer 260a, first, second, third, fourth, fifth, sixth, seventh and eighth lines 261a, 261b, 261c, 261d, 261e, 261f, 261g and 261h, ninth, tenth, eleventh, twelfth, thirteenth, fourteenth, fifteenth and sixteenth lines 271a, 271b, 271c, 271d, 271e, 271f, 271g and 271h, and first, second, third, fourth, fifth, sixth, seventh and eighth vias 281a, 281b, 281c, 281d, 281e, 281f, 281g and 281h. The PCB 250d may further include a first solder resist layer 280a and a second solder resist layer 290a.

The insulation layer 260a, the first solder resist layer 280a and the second solder resist layer 290a in FIG. 16 may be substantially the same as the insulation layer 260, the first solder resist layer 280 and the second solder resist layer 290 in FIG. 2, respectively.

The first through eighth lines 261a-261h are formed on a first surface of the insulation layer 260a. Each of the first through eighth lines 261a-261h may extend in the second direction D2. The first through eighth lines 261a-261h may be arranged in the first direction D1 and may be spaced apart from each other.

The ninth through sixteenth lines 271a-271h are formed on a second surface of the insulation layer 260a opposite to the first surface of the insulation layer 260a. As with the first through eighth lines 261a-261h, each of the ninth through sixteenth lines 271a-271h may extend in the second direction D2. The ninth through sixteenth lines 271a-271h may be arranged in the first direction D1 and may be spaced apart from each other.

In an exemplary embodiment of the present invention, the ninth through sixteenth lines 271a-271h may be disposed on locations of the second surface of the insulation layer 260a that correspond to locations of the first surface of the insulation layer 260a on which the first through eighth lines 261a-261h are disposed, respectively. For example, the ninth line 271a may be disposed on a location of the second surface of the insulation layer 260a that corresponds to a location of the first surface of the insulation layer 260a on which the first line 261a is disposed. The tenth line 271b may be disposed on a location of the second surface of the insulation layer 260a that corresponds to a location of the first surface of the insulation layer 260a on which the second line 261b is disposed. The eleventh line 271c may be disposed on a location of the second surface of the insulation layer 260a that corresponds to a location of the first surface of the insulation layer 260a on which the third line 261c is disposed. The twelfth line 271d may be disposed on a location of the second surface of the insulation layer 260a that corresponds to a location of the first surface of the insulation layer 260a on which the fourth line 261d is disposed. The thirteenth line 271e may be disposed on a location of the second surface of the insulation layer 260a that corresponds to a location of the first surface of the insulation layer 260a on which the fifth line 261e is disposed. The fourteenth line 271f may be disposed on a location of the second surface of the insulation layer 260a that corresponds to a location of the first surface of the insulation layer 260a on which the sixth line 261f is disposed. The fifteenth line 271g may be disposed on a location of the second surface of the insulation layer 260a that corresponds to a location of the first surface of the insulation layer 260a on which the seventh line 261g is disposed. The sixteenth line 271h may be disposed on a location of the second surface of the insulation layer 260a that corresponds to a location of the first surface of the insulation layer 260a on which the eighth line 261h is disposed.

The first through eighth vias 281a-281h are formed through the insulation layer 260a. Each of the first through eighth vias 281a-281h connects one of the first through eighth lines 261a-261h with a respective line, from among the ninth through sixteenth lines 271a-271h. For example, the first via 281a connects the first line 261a with the ninth line 271a. The second via 281b connects the second line 261b with the tenth line 271b. The third via 281c connects the third line 261c with the eleventh line 271c. The fourth via 281d connects the fourth line 261d with the twelfth line 271d. The fifth via 281e connects the fifth line 261e with the thirteenth line 271e. The sixth via 281f connects the sixth line 261f with the fourteenth line 271f. The seventh via 281g connects the seventh line 261g with the fifteenth line 271g. The eighth via 281h connects the eighth line 261h with the sixteenth line 271h.

The PCB 250d may transmit the gate clock signals CK11-CK41 and the inversion gate clock signals CKB11-CKB41 illustrated in FIG. 3. For example, the first through eighth lines 261a-261h may transmit the gate clock signals CK11-CK41 and the inversion gate clock signals CKB11-CKB41, and the ninth through sixteenth lines 271a-271h may also transmit the gate clock signals CK11-CK41 and the inversion gate clock signals CKB11-CKB41.

A pair of lines that are symmetric with respect to the insulation layer 260a may be electrically connected by at least one via and may transmit one of the gate clock signals CK11-CK41 and the inversion gate clock signals CKB11-CKB41. For example, the first and ninth lines 261a and 271a that are electrically connected by the first via 281a may transmit the first gate clock signal CK11 from the PMIC 500 to the gate driver 300. The second and tenth lines 261b and 271b that are electrically connected by the second via 281b may transmit the first inversion gate clock signal CKB11 from the PMIC 500 to the gate driver 300. The third and eleventh lines 261c and 271c that are electrically connected by the third via 281c may transmit the second gate clock signal CK21 from the PMIC 500 to the gate driver 300. The fourth and twelfth lines 261d and 271d that are electrically connected by the fourth via 281d may transmit the second inversion gate clock signal CKB21 from the PMIC 500 to the gate driver 300. Similarly, the fifth and thirteenth lines 261e and 271e may transmit the third gate clock signal CK31 from the PMIC 500 to the gate driver 300, and the sixth and fourteenth lines 261f and 271f may transmit the third inversion gate clock signal CKB31 from the PMIC 500 to the gate driver 300. The seventh and fifteenth lines 261g and 271g may transmit the fourth gate clock signal CK41 from the PMIC 500 to the gate driver 300, and the eighth and sixteenth lines 261h and 271h may transmit the fourth inversion gate clock signal CKB41 from the PMIC 500 to the gate driver 300.

In an exemplary embodiment of the present invention, a relationship between a signal line and a gate clock signal transmitted through the signal line can be changed. However, one gate clock signal or one inversion gate clock signal should be transmitted through a pair of lines that are electrically connected by at least one via.

As described above, one line of a pair of lines may be disposed on the insulation layer 260a, and the other of the pair of lines may be disposed under the insulation layer 260a such that both lines of the pair of lines are substantially totally overlapped with each other. For example, the first line 261a is disposed on the insulation layer 260a and the ninth line 271a is disposed under the insulation layer 260a such that the first and ninth lines 261a and 271a are substantially totally overlapped with each other. The pair of lines may be electrically connected by at least one via. For example, the pair of first and ninth lines 261a and 271a are connected by the first via 281. A gate clock signal (e.g., CK11) or an inversion gate clock signal may be transmitted through the pair of lines. For example, the gate clock signal CK11 or the inversion gate clock signal CKB11 may be transmitted through the pair of first and ninth lines 261a and 271a. Since a pair of lines is used for transmitting one signal, a line resistance may not decrease even if a width d2 of a single line decreases in comparison with that of a single line in a conventional PCB. For example, the width d2 of a single line (e.g., the first line 261a) in FIG. 16 may be a half of the width d1 of a single line (e.g., the first line 262a) in FIG. 2. Accordingly, a size of the PCB 250d may decrease without decreasing performance of the signal transmission.

In an exemplary embodiment of the present invention, a ground layer between the second surface of the insulation layer 260a and the ninth through sixteenth lines 271a-271h may be omitted in the PCB 250d.

In an exemplary embodiment of the present invention, the PCB 250d may further include a plurality of vias other than the first through eighth vias 281a-281h. Each via may electrically connect the pair of lines that are symmetric with respect to the insulation layer 260a with each other.

Although not illustrated in FIG. 16, the PCB 250d may further include a line for transmitting the vertical start signal.

Referring to FIGS. 5 and 17, a PCB 250e on which the PMIC 500 is mounted may include an insulation layer 260a, first, second, third, fourth, fifth, sixth, seventh, eighth, ninth and tenth lines 263a, 263b, 263c, 263d, 263e, 263f, 263g, 263h, 263i and 263j. The PCB 250e includes eleventh, twelfth, thirteenth, fourteenth, fifteenth, sixteenth, seventeenth, eighteenth, nineteenth and twentieth lines 273a, 273b, 273c, 273d, 273e, 273f, 273g, 273h, 273i and 273j. The PCB 250e includes and first, second, third, fourth, fifth, sixth, seventh, eighth, ninth and tenth vias 283a, 283b, 283c, 283d, 283e, 283f, 283g, 283h, 283j and 283i. The PCB 250e may further include a first solder resist layer 280a and a second solder resist layer 290a.

The first through tenth lines 263a-263j are formed on a first surface of the insulation layer 260a. The eleventh through twentieth lines 273a-273j are formed on locations of a second surface of the insulation layer 260a that correspond to locations of the first surface of the insulation layer 260a on which the first through tenth lines 263a-263j are disposed, respectively. The first through tenth vias 283a-283j are formed through the insulation layer 260a. Each of the first through tenth vias 283a-283j connects a line, from among the first through tenth lines 263a-263j with a respective line, from among the eleventh through twentieth lines 273a-273j. For example, the first via 283a connects the first line 263a with the eleventh line 273a.

The PCB 250e may transmit the gate clock signals CK12-CK52 and the inversion gate clock signals CKB12-CKB52 illustrated in FIG. 5. For example, the first through tenth lines 263a-263j may transmit the gate clock signals CK12-CK52 and the inversion gate clock signals CKB12-CKB52. The eleventh through twentieth lines 273a-273j may also transmit the gate clock signals CK12-CK52 and the inversion gate clock signals CKB12-CKB52. A pair of lines that are symmetric with respect to the insulation layer 260a may be electrically connected by at least one via and may transmit a gate clock signal, from among the gate clock signals CK12-CK52 or an inversion gate signal, from among the inversion gate clock signals CKB12-CKB52.

Referring to FIGS. 7 and 18, a PCB 250f on which the PMIC 500 is mounted may include an insulation layer 260a, first, second, third and fourth lines 265a, 265b, 265c and 265d, and fifth, sixth, seventh and eighth lines 275a, 275b, 275c and 275d. The PCB 250f may include first, second, third and fourth vias 285a, 285b, 285c and 285d. The PCB 250f may further include a first solder resist layer 280a and a second solder resist layer 290a.

The first through fourth lines 265a-265d are formed on a first surface of the insulation layer 260a. The fifth through eighth lines 275a-275d are formed on a second surface of the insulation layer 260a opposite to the first surface of the insulation layer 260a. The fifth through eighth lines 275a-275d may be disposed on locations of the second surface of the insulation layer 260a that correspond to locations of the first surface of the insulation layer 260a on which the first through fourth lines 265a-265d are disposed, respectively. The first through fourth vias 285a-285d are formed through the insulation layer 260a. Each of the first through fourth vias 285a-285d connects a line, from among the first through fourth lines 265a-265d with a respective line, from among the fifth through eighth lines 275a-275d. For example, the first via 285a connects the first line 265a with the fifth line 275a. The second via 285b connects the second line 265b with the sixth line 275*b*. The third via 285*c* connects the third line 265*c* with the seventh line 275*c*. The fourth via 285*d* connects the fourth line 265*d* with the eighth line 275*d*.

The PCB 250*f* may transmit the first and second gate clock signals CK13 and CK23 and the first and second inversion gate clock signals CKB13 and CKB23 in FIG. 7. For example, the first through fourth lines 265*a*-265*d* may transmit the first and second gate clock signals CK13 and CK23 and the first and second inversion gate clock signals CKB13 and CKB23, and the fifth through eighth lines 275*a*-275*d* may also transmit the first and second gate clock signals CK13 and CK23 and the first and second inversion gate clock signals CKB13 and CKB23. A pair of lines that are symmetric with respect to the insulation layer 260*a* may be electrically connected by at least one via. The symmetric pair of lines may transmit the first gate clock signal CK13, the second gate clock signal CK23, the first inversion gate clock signal CKB13, or the second inversion gate clock signal CKB23. The first and fifth lines 265*a* and 275*a* are a symmetric pair of lines, the second and sixth lines 265*b* and 275*b* are a symmetric pair of lines, the third and seventh lines 265*c* and 275*c* are a symmetric pair of lines, and the fourth and eighth lines 265*d* and 275*d* are a symmetric pair of lines.

Referring to FIGS. 9 and 19, a PCB 250*g* on which the PMIC 500 is mounted may include an insulation layer 260*a*, first, second, third, fourth, fifth and sixth lines 267*a*, 267*b*, 267*c*, 267*d*, 267*e* and 267*f*. The PCB 250*g* includes seventh, eighth, ninth, tenth, eleventh and twelfth lines 277*a*, 277*b*, 277*c*, 277*d*, 277*e* and 277*f*. The PCB 250*g* includes and first, second, third, fourth, fifth and sixth vias 287*a*, 287*b*, 287*c*, 287*d*, 287*e* and 287*f*. The PCB 250*g* may further include a first solder resist layer 280*a* and a second solder resist layer 290*a*.

The first through sixth lines 267*a*-267*f* are formed on a first surface of the insulation layer 260*a*. The seventh through twelfth lines 277*a*-277*f* are formed on a second surface of the insulation layer 260*a* opposite to the first surface of the insulation layer 260*a*. The seventh through twelfth lines 277*a*-277*f* may be disposed on locations of the second surface of the insulation layer 260*a* that correspond to locations of the first surface of the insulation layer 260*a* on which the first through sixth lines 267*a*-267*f* are disposed, respectively. The first through sixth vias 287*a*-287*f* are formed through the insulation layer 260*a*. Each of the first through sixth vias 287*a*-287*f* connects a line, from among the first through sixth lines 267*a*-267*f* with a respective line, from among the seventh through twelfth lines 277*a*-277*f*. For example, the first via 287*a* connects the first line 267*a* with the seventh line 277*a*, the second via 287*b* connects the second line 267*b* with the eighth line 277*b*, and the like.

The PCB 250*g* may transmit the first to third gate clock signals CK14-CK34 and the first to third inversion gate clock signals CKB14-CKB34 in FIG. 9. For example, the first through sixth lines 267*a*-267*f* may transmit the gate clock signals CK14-CK34 and the inversion gate clock signals CKB14-CKB34. The seventh through twelfth lines 277*a*-277*f* may also transmit the gate clock signals CK14-CK34 and the inversion gate clock signals CKB14-CKB34. A pair of lines that are symmetric with respect to the insulation layer 260*a* may be electrically connected by at least one via and may transmit one of the first to third gate clock signals CK14-CK34 and the first to third inversion gate clock signals CKB14-CKB34. For example, as described above, the first via 287*a* connects the first line 267*a* with the seventh line 277*a*. The first and seventh lines 267*a* and 277*a* are symmetric, the second and eighth lines 267*b* and 277*b* are symmetric, the third and ninth lines 267*c* and 277*c* are symmetric, and the like. For example, the first and seventh lines 267*a* and 277*a* may transmit the first gate clock signal CK14. The second and eighth lines 267*b* and 277*b* may transmit the first inversion gate clock signal CKB14, the third and ninth lines 267*c* and 277*c* may transmit the second gate clock signal CK24, and the like.

Although the structures including the signal lines and the gate clock signals transmitted through the structures are described based on the examples where the PMIC 500 generates two, three, four and five gate clock signals (e.g., based on FIGS. 3, 5, 7, 9, 15, 16, 17, 18 and 19), the PMIC 500 may generate any number (e.g., six, seven, eight, to N, N being a positive nonzero integer) of the gate clock signals. In addition, the structures and the gate clock signals may be changed depending on the number of the gate clock signals.

In a display apparatus, according to an exemplary embodiment of the present invention, each gate signal may have the ON level for at least two consecutive horizontal time periods (e.g., 2H). To generate the gate signal having the ON level for at least two consecutive horizontal time periods, the PMIC may generate at least two gate clock signals CK such that a phase of one of the gate clock signals CK partially overlaps a phase of another gate clock signals CK, as described above with reference to FIGS. 3, 5, 7 and 9. To provide the gate clock signals CK from the PMIC to the gate driver, the PCB on which the PMIC is mounted may have the structure described above with reference to FIGS. 2, 4, 6 and 8, or the structure described above with reference to FIGS. 16, 17, 18 and 19. Accordingly, the PCB on which the PMIC is mounted may have a small size, and thus the display apparatus may have a small bezel width. In addition, the display apparatus may have an increased duration for charging the pixels. Thus, the display apparatus may have an increased display quality.

The above described embodiments may be used in a display apparatus and/or a system including the display apparatus, such as a mobile phone, a smart phone, a personal digital assistant (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display apparatus comprising:
a printed circuit board (PCB);
a power management integrated circuit (PMIC) mounted on the PCB, wherein the PMIC is configured to generate first, second, third and fourth gate clock signals and first, second, third and fourth inversion gate clock signals, wherein a phase of the first gate clock signal partially overlaps a phase of the second, third or fourth gate clock signal, wherein each of the first to fourth inversion gate clock signals has a phase opposite to that of a respective one of the first to fourth gate clock signals;
a gate driver configured to generate a plurality of gate signals based on the first to fourth gate clock signals and the first to fourth inversion gate clock signals, wherein the gate driver is configured to apply the plurality of gate signals to a plurality of gate lines; and a display panel connected to the plurality of gate lines, wherein the PCB includes:
- an insulation layer;
- first, second, third and fourth lines disposed on a first surface of the insulation layer, wherein the first to fourth lines transmit the first to fourth gate clock signals, respectively; and
- fifth, sixth, seventh and eighth lines disposed on a second surface of the insulation layer, wherein the second surface of the insulation layer faces the first surface of the insulation layer, wherein the fifth to eighth lines transmit the first to fourth inversion gate clock signals, respectively.

2. The display apparatus of claim 1, wherein the first to fourth lines extend in a first direction, are disposed in a second direction that crosses the first direction, and are spaced apart from each other in the second direction, and
wherein the fifth to eighth lines are disposed on locations of the second surface of the insulation layer that correspond to locations of the first surface of the insulation layer where the first to fourth lines are disposed, respectively.

3. The display apparatus of claim 2, wherein the first line on the first surface of the insulation layer transmits the first gate clock signal from the PMIC to the gate driver, and
wherein the fifth line is disposed on a location of the second surface of the insulation layer that corresponds to a location of the first surface of the insulation layer where the first line is disposed, wherein the fifth line transmits the first inversion gate clock signal from the PMIC to the gate driver.

4. The display apparatus of claim 1, wherein each of the gate clock signals has an ON level for at least four consecutive horizontal time periods, and
wherein a duration during which the first gate clock signal has the ON level and a duration during which the second gate clock signal has the ON level overlap for at least three consecutive horizontal time periods.

5. The display apparatus of claim 1, wherein the display panel includes a display region including a plurality of pixels and a peripheral region surrounding the display region, and
wherein the gate driver is disposed in the peripheral region of the display panel.

6. The display apparatus of claim 5, further comprising:
a flexible PCB (FPCB) configured to electrically connect the PCB with the display panel, and
wherein the first to fourth gate clock signals and the first to fourth inversion gate clock signals are provided from the PMIC to the gate driver through the first to eighth lines in the PCB, and through a plurality of lines in the FPCB.

7. The display apparatus of claim 6, further comprising:
a data driver disposed on the FPCB, wherein the data driver is configured to generate a plurality of data voltages to be applied to a plurality of data lines connected to the display panel.

8. The display apparatus of claim 1, wherein the PCB further includes:
a first solder resist layer disposed on the first surface of the insulation layer on which the first, second, third and fourth lines are disposed; and
a second solder resist layer disposed on the second surface of the insulation layer on which the fifth, sixth, seventh and eighth lines are disposed.

9. The display apparatus of claim 1, wherein the PMIC further generates a fifth gate clock signal and a fifth inversion gate clock signal, wherein a phase of the fifth gate clock signal partially overlaps a phase of the first, second, third or fourth gate clock signal, wherein the fifth inversion gate clock signal has a phase opposite to that of the fifth gate clock signal,
wherein the gate driver generates the plurality of gate signals based on the first to fifth gate clock signals and the first to fifth inversion gate clock signals, and
wherein the PCB further includes:
- a ninth line disposed on the first surface of the insulation layer, wherein the ninth line transmits the fifth gate clock signal; and
- a tenth line disposed on the second surface of the insulation layer, wherein the tenth line transmits the fifth inversion gate clock signal.

10. The display apparatus of claim 1, wherein a ground layer between the second surface of the insulation layer and the fifth to eighth lines is omitted.

11. The display apparatus of claim 1, wherein a difference between a low voltage level of the gate clock signals and a high voltage level of the gate clock signals is greater than about 10 Volts.

12. A display apparatus comprising:
a printed circuit board (PCB);
a power management integrated circuit (PMIC) mounted on the PCB, wherein the PMIC is configured to generate first and second gate clock signals and first and second inversion gate clock signals, wherein a phase of the first gate clock signal partially overlaps a phase of the second gate clock signal, wherein each of the first and second inversion gate clock signals has a phase that is inverted with respect to a phase of one of the first and second gate clock signals, respectively;
a gate driver configured to generate a plurality of gate signals based on the first and second gate clock signals and the first and second inversion gate clock signals, wherein the gate driver is configured to apply the plurality of gate signals to a plurality of gate lines; and
a display panel connected to the plurality of gate lines, wherein the PCB includes:
- an insulation layer;
- first and second lines disposed on a first surface of the insulation layer, wherein the first and second lines transmit the first and second gate clock signals, respectively; and
- third and fourth lines disposed on a second surface of the insulation layer, wherein the second surface of the insulation layer faces the first surface of the insulation layer, wherein the third and fourth lines transmit the first and second inversion gate clock signals, respectively.

13. The display apparatus of claim 12, wherein the first and second lines extend in a first direction, are disposed in a second direction that crosses the first direction, and are spaced apart from each other in the second direction, and
wherein the third and fourth lines are disposed on locations of the second surface of the insulation layer that correspond to locations of the first surface of the insulation layer where the first and second lines are disposed, respectively.

14. The display apparatus of claim 13, wherein the first line on the first surface of the insulation layer transmits the first gate clock signal from the PMIC to the gate driver, and
wherein the third line is disposed on a location of the second surface of the insulation layer that corresponds to a location of the first surface of the insulation layer where the first line is disposed, wherein the third line transmits the first inversion gate clock signal from the PMIC to the gate driver.

15. The display apparatus of claim 12, wherein the PMIC further generates a third gate clock signal and a third inversion gate clock signal, wherein a phase of the third gate clock signal partially overlaps a phase of the first or second gate clock signal, wherein the third inversion gate clock signal has a phase that is inverted with respect to a phase of the third gate clock signal,
wherein the gate driver generates the plurality of gate signals based on the first to third gate clock signals and the first to third inversion gate clock signals, and
wherein the PCB further includes:
a fifth line disposed on the first surface of the insulation layer, wherein the fifth line transmits the third gate clock signal; and
a sixth line disposed on the second surface of the insulation layer, wherein the sixth line transmits the third inversion gate clock signal.

16. A display apparatus comprising:
a printed circuit board (PCB);
a power management integrated circuit (PMIC) mounted on the PCB, wherein the PMIC is configured to generate first, second, third and fourth gate clock signals and first, second, third and fourth inversion gate clock signals, wherein a phase of the first gate clock signal partially overlaps a phase of the second, third or fourth gate clock signal, wherein each of the first to fourth inversion gate clock signals has a phase that is inverted with respect to a phase of one of the first to fourth gate clock signals, respectively;
a gate driver configured to generate a plurality of gate signals based on the first to fourth gate clock signals and the first to fourth inversion gate clock signals, wherein the gate driver is configured to apply the plurality of gate signals to a plurality of gate lines; and
a display panel connected to the plurality of gate lines, wherein the PCB includes:
an insulation layer;
first, second, third, fourth, fifth, sixth, seventh and eighth lines disposed on a first surface of the insulation layer, wherein the first to eighth lines transmit the first to fourth gate clock signals and the first to fourth inversion gate clock signals, respectively;
ninth, tenth, eleventh, twelfth, thirteenth, fourteenth, fifteenth and sixteenth lines disposed on a second surface of the insulation layer, wherein the second surface of the insulation layer faces the first surface of the insulation layer, wherein the ninth to sixteenth lines transmit the first to fourth gate clock signals and the first to fourth inversion gate clock signals, respectively; and
first, second, third, fourth, fifth, sixth, seventh and eighth vias formed through the insulation layer, wherein each of the first to eighth vias connects one of the first to eighth lines with a respective line, from among the ninth to sixteenth lines.

17. The display apparatus of claim 16, wherein the first to eighth lines extend in a first direction, are disposed in a second direction that crosses the first direction, and are spaced apart from each other in the second direction, and
wherein the ninth to sixteenth lines are disposed on locations of the second surface of the insulation layer that correspond to locations of the first surface of the insulation layer where the first to eighth lines are disposed, respectively.

18. The display apparatus of claim 17, wherein the first line on the first surface of the insulation layer and the ninth line on the second surface of the insulation layer are electrically connected by the first via and transmit the first gate clock signal from the PMIC to the gate driver.

19. The display apparatus of claim 16, wherein each of the gate clock signals has an ON level for at least four consecutive horizontal time periods, and
wherein a duration during which the first gate clock signal has the ON level and a duration during which the second gate clock signal has the ON level overlap for at least three consecutive horizontal time periods.

20. The display apparatus of claim 16, wherein the display panel includes a display region including a plurality of pixels and a peripheral region surrounding the display region, and
wherein the gate driver is disposed in the peripheral region of the display panel.

* * * * *